(12) United States Patent
Lee et al.

(10) Patent No.: US 10,438,998 B2
(45) Date of Patent: Oct. 8, 2019

(54) INTEGRATED-CIRCUIT DEVICES INCLUDING DIFFERENT TYPES OF MEMORY CELLS AND METHODS OF FORMING THE SAME

(71) Applicant: SAMSUNG ELECTRONICS CO., LTD., Suwon-si, Gyeonggi-do (KR)

(72) Inventors: Kilho Lee, Busan (KR); Gwanhyeob Koh, Seoul (KR); Hongsoo Kim, Seongnam-si (KR); Junhee Lim, Seoul (KR); Chang-Hoon Jeon, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/828,937

(22) Filed: Dec. 1, 2017

(65) Prior Publication Data
US 2018/0358408 A1 Dec. 13, 2018

(30) Foreign Application Priority Data
Jun. 7, 2017 (KR) .................. 10-2017-0070863

(51) Int. Cl.
| | | |
|---|---|---|
| G11C 5/02 | (2006.01) | |
| H01L 27/24 | (2006.01) | |
| G11C 11/00 | (2006.01) | |
| H01L 45/00 | (2006.01) | |
| H01L 27/11573 | (2017.01) | |
| G11C 13/00 | (2006.01) | |
| H01L 27/22 | (2006.01) | |

(Continued)

(52) U.S. Cl.
CPC ............ *H01L 27/228* (2013.01); *G11C 5/025* (2013.01); *G11C 11/005* (2013.01); *G11C 11/1659* (2013.01); *H01L 27/11573* (2013.01); *H01L 27/11582* (2013.01); *H01L 27/224* (2013.01); *H01L 27/2436* (2013.01);
(Continued)

(58) Field of Classification Search
CPC ..... H01L 27/228; H01L 27/224; H01L 28/20; H01L 27/2463; H01L 43/08; H01L 27/2436; H01L 27/11582; H01L 27/11573; H01L 45/1233; H01L 45/06; H01L 45/04; G11C 11/1659; G11C 5/025; G11C 13/00; G11C 11/005; G11C 2213/79; G11C 13/0004; G11C 13/0002; G11C 11/161
See application file for complete search history.

(56) References Cited

U.S. PATENT DOCUMENTS 6,590,244 B2  7/2003 Asao et al.
7,141,842 B2  11/2006 Kajiyama
(Continued)

*Primary Examiner* — Steven H Loke
*Assistant Examiner* — Juanita B Rhodes
(74) *Attorney, Agent, or Firm* — Myers Bigel, P.A.

(57) ABSTRACT

Integrated circuit devices may include a substrate including a flash memory region and a variable resistance memory region, a flash memory cell transistor including a cell gate electrode that overlaps the flash memory region of the substrate, a variable resistance element that overlaps the variable resistance memory region of the substrate, and a select transistor including a select source/drain region that is disposed in the variable resistance memory region of the substrate. The select source/drain region may be electrically connected to the variable resistance element. The substrate may include an upper surface facing the cell gate electrode and the variable resistance element, and the upper surface of the substrate may continuously extend from the flash memory region to the variable resistance memory region.

20 Claims, 19 Drawing Sheets

(51) Int. Cl.
   *G11C 11/16*     (2006.01)
   *H01L 43/08*     (2006.01)
   *H01L 49/02*     (2006.01)
   *H01L 27/11582*  (2017.01)

(52) U.S. Cl.
   CPC .......... *H01L 27/2463* (2013.01); *H01L 28/20* (2013.01); *H01L 43/08* (2013.01); *H01L 45/04* (2013.01); *H01L 45/06* (2013.01); *H01L 45/1233* (2013.01); *G11C 11/161* (2013.01); *G11C 13/0002* (2013.01); *G11C 13/0004* (2013.01); *G11C 2213/79* (2013.01)

(56) References Cited

U.S. PATENT DOCUMENTS

| | | | |
|---|---|---|---|
| 8,686,392 B2 | 4/2014 | Tsukamoto | |
| 8,760,920 B2 | 6/2014 | Kim et al. | |
| 8,896,096 B2 | 11/2014 | Tu et al. | |
| 2005/0036362 A1* | 2/2005 | Iwata | G11C 11/15 365/158 |
| 2009/0261434 A1* | 10/2009 | Kang | H01L 43/08 257/421 |
| 2012/0213009 A1* | 8/2012 | Aritome | G11C 16/0408 365/185.29 |
| 2014/0042508 A1* | 2/2014 | Lee | H01L 27/228 257/295 |
| 2015/0039814 A1* | 2/2015 | Lim | G06F 12/0246 711/103 |
| 2015/0145015 A1* | 5/2015 | Shin | H01L 27/11556 257/314 |
| 2016/0163635 A1* | 6/2016 | Yun | H01L 23/3192 257/508 |
| 2016/0254440 A1* | 9/2016 | Wang | H01L 43/08 257/421 |
| 2017/0069827 A1 | 3/2017 | Lee et al. | |
| 2017/0092693 A1 | 3/2017 | Tan et al. | |
| 2017/0110192 A1* | 4/2017 | Zhou | G11C 14/0009 |

* cited by examiner

INTEGRATED-CIRCUIT DEVICES INCLUDING DIFFERENT TYPES OF MEMORY CELLS AND METHODS OF FORMING THE SAME

CROSS-REFERENCE TO RELATED APPLICATION

This U.S. non-provisional patent application claims priority under 35 U.S.C. § 119 to Korean Patent Application No. 10-2017-0070863 filed on Jun. 7, 2017, in the Korean intellectual Property Office, the disclosure of which is hereby incorporated by reference in its entirety.

BACKGROUND

The present inventive concepts relate to the field of electronics, and more particularly, to integrated-circuit chips.

Integrated-circuit devices, such as semiconductor devices, can be classified into memory devices and logic devices. Memory devices store data and can be classified into volatile memory devices and nonvolatile memory devices. Volatile memory devices, for example, DRAM (Dynamic Random Access Memory) and SRAM (Static Random Access Memory), loses stored data when its power supply is interrupted (e.g., when the power is turned off). Nonvolatile memory devices, for example, PROM (programmable ROM), EPROM (erasable PROM), EEPROM (electrically EPROM), and Flash memory device, does not lose stored data even when its power supply interrupted. Next generation memory devices, for example, MRAM (magnetic random access memory) and PRAM (phase change random access memory), are recently being developed for high performance and low power consumption. Next generation memory devices include a material having different resistance values according to current and/or voltage applied thereto, and the resistance values are maintained even power supply is interrupted.

SUMMARY

Integrated circuit devices may include a substrate including a flash memory region and a variable resistance memory region, a flash memory cell transistor including a cell gate electrode that overlaps the flash memory region of the substrate, a variable resistance element that overlaps the variable resistance memory region of the substrate, and a select transistor including a select source/drain region that is disposed in the variable resistance memory region of the substrate. The select source/drain region may be electrically connected to the variable resistance element. The substrate may include an upper surface facing the cell gate electrode and the variable resistance element, and the upper surface of the substrate may continuously extend from the flash memory region to the variable resistance memory region.

Integrated circuit devices may include a substrate including a flash memory region and a variable resistance memory region, a flash memory cell transistor including a cell gate electrode that overlaps the flash memory region of the substrate, a variable resistance element that overlaps the variable resistance memory region of the substrate, a select element configured to control current flowing through the variable resistance element, and an interlayer insulating layer extending continuously to overlap both the flash memory cell transistor and the select element.

Integrated circuit devices may include a substrate, a flash memory cell transistor including a cell gate electrode that is disposed on the substrate, and a peripheral transistor that is configured to generate a signal for operation of the flash memory cell transistor. The peripheral transistor may include a peripheral gate electrode and a peripheral source/drain region that is disposed in the substrate. The integrated circuit devices may also include a variable resistance element on the substrate and a select transistor that is configured to control current flowing through the variable resistance element and may include a select source/drain region that is disposed in the substrate.

DETAILED DESCRIPTION

Example embodiments of the present inventive concepts will be described in conjunction with the accompanying drawings. Like reference numbers refer to like elements throughout the various figures unless otherwise specified.

As used herein the term "and/or" includes any and all combinations of one or more of the associated listed items.

It will be understood that "an element A covering an element B" (or similar language) means that the element A is on the element B but does not necessarily mean that the element A covers the element B entirely. It will be also understood that "an element C and an element D are formed concurrently" (or similar language) means that the element C and the element D are formed using the same process, at approximately (hut not necessarily exactly) the same time.

Figure 1:
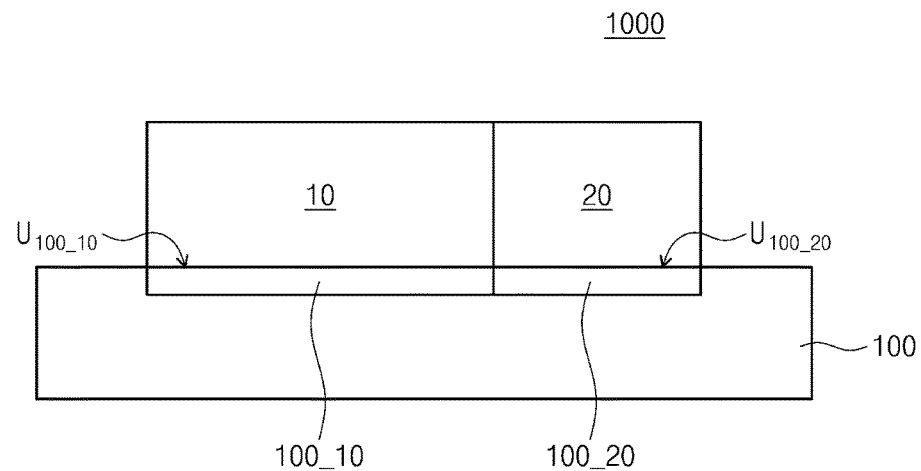
FIG. 1 illustrates a simplified cross-sectional view of a semiconductor device according to example embodiments of the present inventive concepts.

FIG. 1 illustrates a simplified cross-sectional view of a semiconductor device according to example embodiments of the present inventive concepts.

Referring to FIG. 1, a semiconductor device 1000 may include a first memory section 10 and a second memory section 20 disposed side by side. The semiconductor device 1000 may include a substrate 100 that includes a first memory region 100_10 and a second memory region 100_20. The substrate 100 including the first and second memory regions 100_10 and 100_20 may be a portion of a single wafer (e.g., a single wafer of single crystal semiconductor material), and more specifically, the substrate 100 including the first and second memory regions 100_10 and 100_20 may be a portion of a single wafer included in a single chip. Accordingly, the substrate 100 may have continuous crystal structure and may have a unitary structure. The first memory region 100_10 and the second memory region 100_20 may be connected to each other, in some embodiments, directly connected to each other without any intervening element, and no discontinuity of crystal structure exists between the first memory region 100_10 and the second memory region 100_20. As illustrated in FIG. 1, an upper surface, $U_{100\_10}$, of the first memory region 100_10 and an upper surface, $U_{100\_20}$, of the second memory region 100_20 may be directly connected to each other such that continuously extend.

The first memory section 10 may include a flash memory cell structure, and the first memory region 100_10 of the substrate 100 may be referred to as a flash memory region. The second memory section 20 may include a variable resistance memory cell structure, and the second memory region 100_20 of the substrate 100 may be referred to as a variable resistance memory region. In some embodiments, each of the first and second memory sections 10 and 20 may function as a main memory. In some embodiments, the first memory section 10 may function as a main memory, and the second memory section 20 may serve as a buffer memory.

Figure 2:
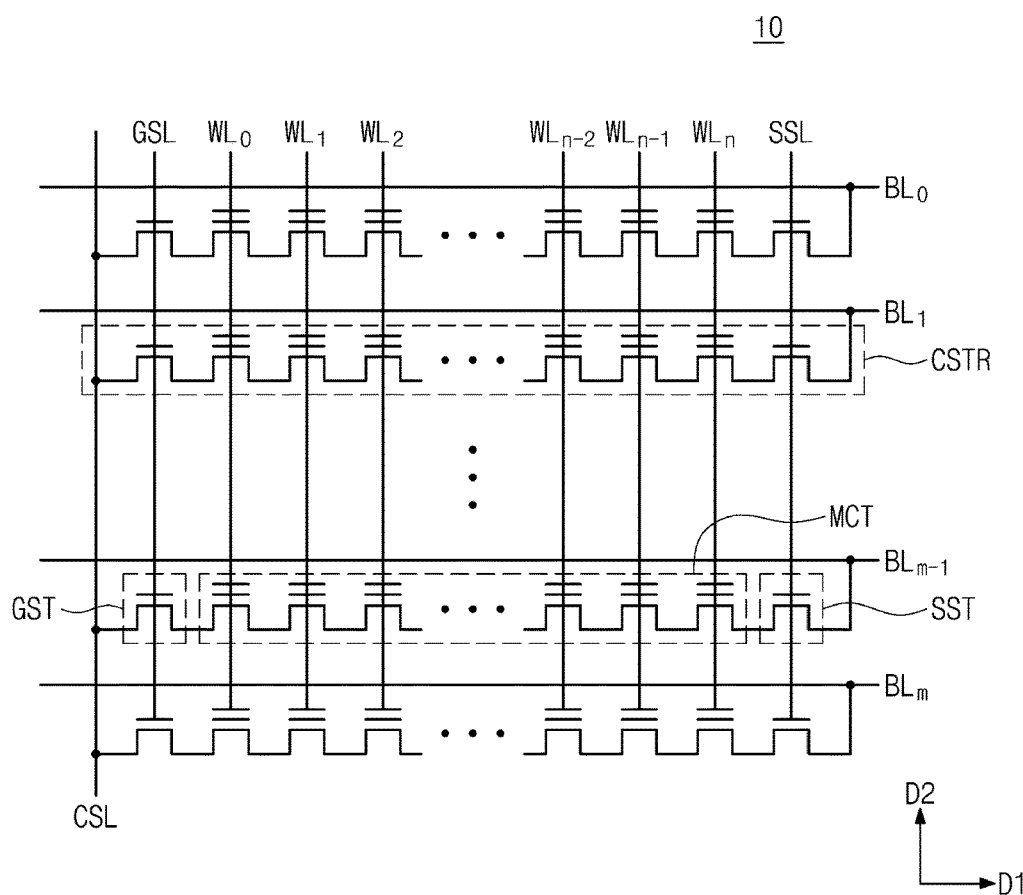
FIGS. 2 to 4 illustrate circuit diagrams of a memory cell array in a first memory section of FIG. 1 according to example embodiments of the present inventive concepts.
Figure 3:
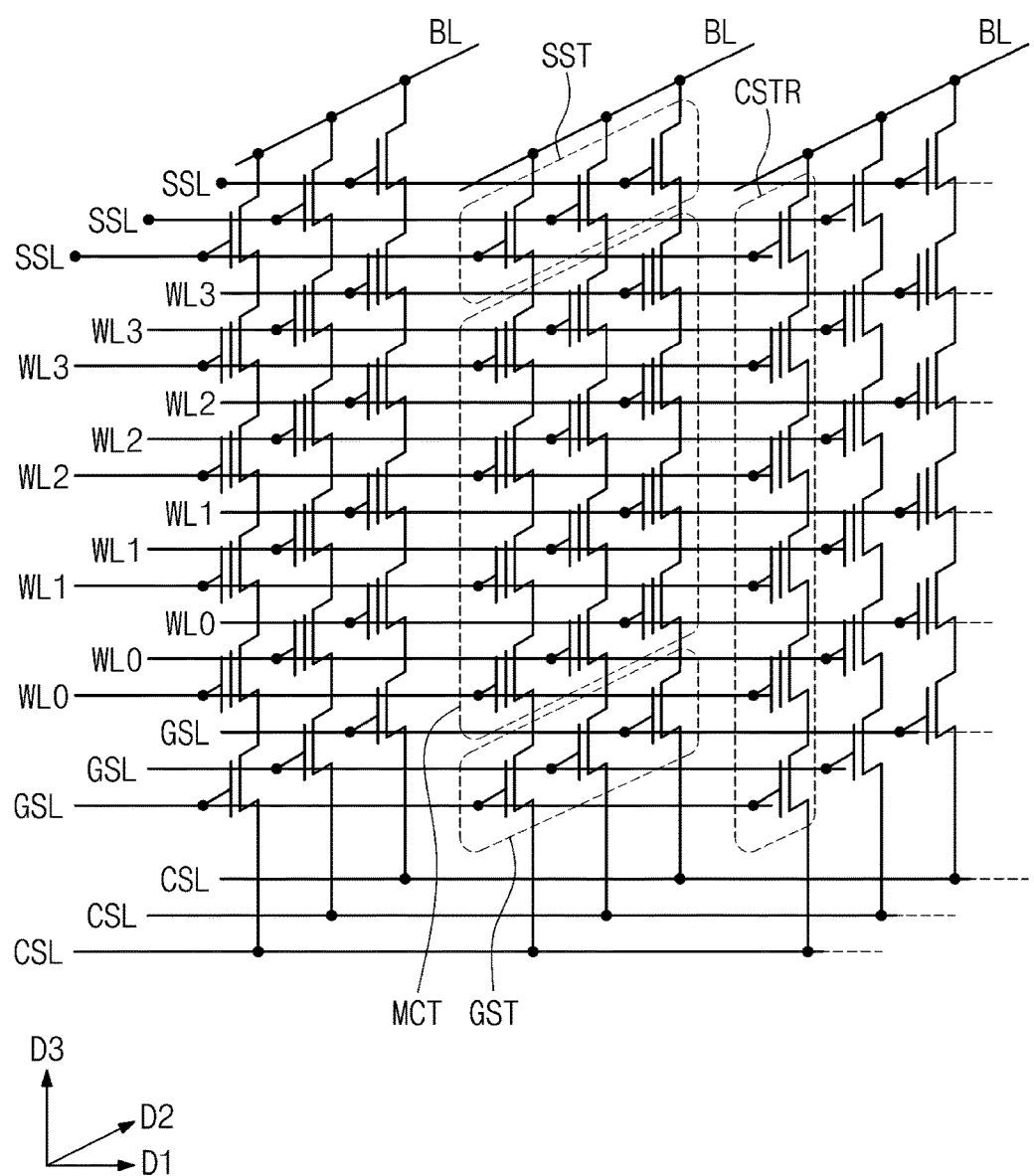
Figure 4:
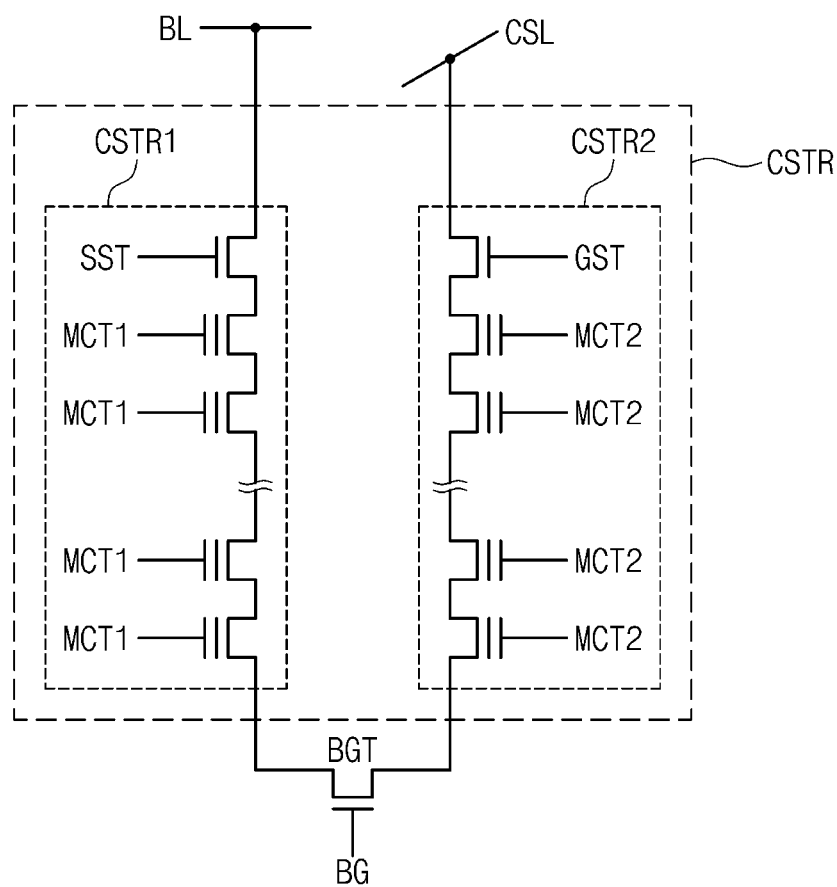

FIGS. 2 to 4 illustrate circuit diagrams of a memory cell array in the first memory section 10 of FIG. 1 according to example embodiments of the present inventive concepts.

Referring to FIG. 2, in some embodiments, the first memory section 10 may include a two-dimensional NAND flash memory cell array (e.g., a planar NAND flash memory cell array). For example, the first memory section 10 may include a plurality of cell strings CSTR. Each of the plurality of cell strings CSTR may include a string select transistor SST connected to a string select line SSL, a plurality of memory cell transistors MCT connected to a plurality of word lines $WL_0$ to $WL_n$ (where n is a natural number), respectively, and a ground select transistor GST connected to a ground select line GSL. The string select transistor SST may be connected to one of a plurality of bit lines $BL_0$ to $BL_m$ (where m is a natural number), and the ground select transistor GST may be connected to a common source line CSL. The bit lines $BL_0$ to $BL_m$ may extend in a first direction D1, and the string select line SSL, the word lines $WL_0$ to $WL_n$, and the ground select line GSL may extend in a second direction D2 crossing the first direction D1. The first and second directions D1 and D2 may be parallel to a top surface of the substrate 100. It will be understood that the first and second directions D1 and D2 can be referred to as a first horizontal direction D1 and a second horizontal direction D2, respectively.

In some embodiments, the string select line SSL, the word lines $WL_0$ to $WL_n$, and the ground select line GSL may be disposed at substantially the same level from the substrate 100. The string select line SSL, the word lines $WL_0$ to $WL_n$, and the ground select line GSL may be gate electrodes of the string select transistor SST, the memory cell transistors MCT, and the ground select transistor GST, respectively. Each of the memory cell transistors MCT may include a data storage element (e.g., a floating gate, and a charge trapping layer).

Referring to FIG. 3, in some embodiments, the first memory section 10 may include a three-dimensional NAND flash memory cell array (e.g., a vertical NAND flash memory cell array). For example, the first memory section 10 may include common source lines CSL, a plurality of bit lines BL, and a plurality of cell strings CSTR between the common source line CLS and the bit lines BL. The common source line CSL may be a conductive thin layer disposed on the substrate 100 of FIG. 1 or an impurity region formed in the substrate 100. The bit lines BL may be conductive patterns (e.g., metal lines) disposed on the substrate 100 that are spaced apart from the substrate 100 in a third direction D3 that is perpendicular to the top surface of the substrate 100. It will be understood that the third direction D3 can be referred to as a vertical direction D3. In some embodiments, as illustrated in FIG. 3, bit lines BL may extend in the second direction D2 and may be spaced apart from each other in the first direction D1, and a plurality of cell strings CSTR may be connected in parallel to one of the bit lines BL. Multiple cell strings CSTR may be connected in common to a single common source line CSL. In some embodiments, the common source line CSL may be provided in plural, which may be two-dimensionally arranged. The common source lines CSL may be supplied with the same voltage or electrically controlled independently.

Each of the cell strings CSTR may include a ground select transistor GST connected to the common source line CSL, a string select transistor SST connected to the bit line BL, and a plurality of memory cell transistors MCT between the ground and string select transistors GST and SST. The ground select transistor GST, the string select transistor SST, and the memory cell transistors MCT may be connected in series. A single common source line CSL may be connected in common to sources of the ground select transistors GST. A plurality of ground select lines GSL, a plurality of word lines WL0 to WL3, and a plurality of string select lines SSL, which may be used as gate electrodes of the ground select transistor GST, the memory cell transistors MCT, and the string select transistor SST, respectively, may be disposed between the common source lines CLS and the bit lines BL. Each of the memory cell transistors MCT may include a data storage element.

Referring to FIG. 4, in some embodiments, the first memory section 10 may include a three-dimensional NAND flash memory cell array. For example, the first memory section 10 may include a common source line CSL, a bit line BL, and a cell string CSTR between the common source line CLS and the bit line BL. The common source line CSL may be a conductive thin layer (or a conductive pattern) disposed on the substrate 100 of FIG. 1, and the bit line BL may be a conductive pattern (e.g., a metal line) disposed on the substrate 100. The cell string CSTR may include an upper string CSTR1 connected to the bit line BL and a lower string CSTR2 connected to the common source line CSL. The upper string CSTR1 may be connected to the lower string CSTR2 through a back gate transistor BGT. The back gate transistor BGT may be controlled by a back gate line BG provided on the substrate 100 of FIG. 1. The upper string CSTR1 may include a string select transistor SST connected to the bit line BL and a plurality of upper memory cell transistors MCT1 between the string select transistor SST and the back gate transistor BGT. The string select transistor SST and the upper memory cell transistors MCT1 may be connected in series, as illustrated in FIG. 4. The lower string CSTR2 may include a ground select transistor GST connected to the common source line CSL and a plurality of lower memory cell transistors MCT2 between the ground select transistor GST and the back gate transistor BGT. The ground select transistor GST and the lower memory cell transistors MCT2 may be connected in series, as illustrated in FIG. 4. Each of the upper and lower memory cell transistors MCT1 and MCT2 may include a data storage element.

Figure 5:
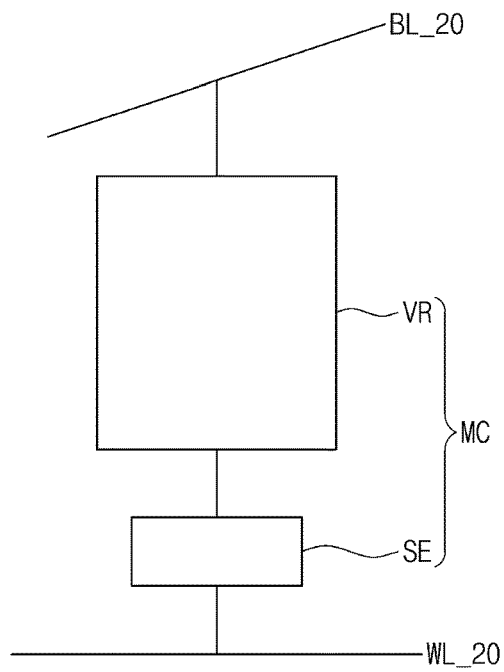
FIG. 5 illustrates a unit memory cell in a second memory section of FIG. 1 according to example embodiments of the present inventive concepts.

FIG. 5 illustrates a unit memory cell in the second memory section 20 of FIG. 1 according to example embodiments of the present inventive concepts.

Referring to FIG. 5, the second memory section 20 may include a variable resistance memory cell array. The variable resistance memory cell array may include one or more of a Magnetoresistive Random Access Memory (MRAM) cell array, a Phase-change Random Access Memory (PRAM) cell array, and a Resistive Random Access Memory (RRAM) cell array. The variable resistance memory cell array may include memory cells MC that are two- or three-dimensionally arranged on the substrate 100 of FIG. 1. Each of the memory cells MC may be connected between a word line WL_20 and a bit line BL_20 crossing each other. Each of the memory cells MC may include a variable resistance element VR and a select element SE. The variable resistance element VR may be connected between the bit line BL_20 and the select element SE, and the select element SE may be connected between the variable resistance element VR and the word line WL_20.

The variable resistance element VR may include a data storage element. The variable resistance element VR may be switched between two resistance states when an electrical signal is applied to the variable resistance element VR. The variable resistance element VR may be formed to have a thin-film structure whose electrical resistance can be changed by a spin transferring phenomenon of an electrical current passing through the variable resistance element VR. The variable resistance element VR may include a thin-film structure configured to exhibit a magneto-resistance property and may include at least one ferromagnetic material and/or at least one anti-ferromagnetic material. The select element SE may be configured to control current flowing through the variable resistance element VR. For example, the select element SE may be one of a diode, a PNP bipolar transistor, an NPN bipolar transistor, an NMOS field effect transistor, and a PMOS field effect transistor. If the select element SE is a three-terminal device such as a bipolar transistor or a MOS field effect transistor, an additional connection line may be connected to the select element SE.

Figure 6:
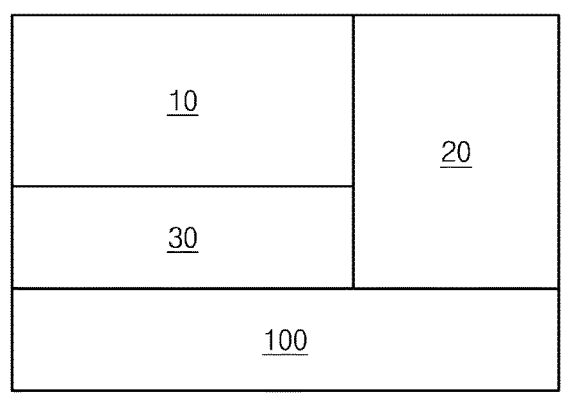
FIG. 6 illustrates a simplified cross-sectional view of a semiconductor device according to example embodiments of the present inventive concepts.

FIG. 6 illustrates a simplified cross-sectional view of a semiconductor device according to example embodiments of the present inventive concepts.

Referring to FIG. 6, the semiconductor device 1000 may include the first memory section 10, the second memory section 20 and may further include a peripheral circuit section 30 between the substrate 100 and the first memory section 10. The peripheral circuit section 30 and the first memory section 10 may be sequentially stacked on the substrate 100 and may be disposed on a side of the second memory section 20.

The first memory section 10 may include first memory cells that are two- or three-dimensionally arranged on the substrate 100. The first memory cells may correspond to the memory cell transistors MCT, MCT1, and MCT2 discussed with reference to FIGS. 2 to 4. The second memory section 20 may include at least one second memory cell. The second memory cell may correspond to the memory cell MC discussed with reference to FIG. 5. For example, the second memory cell may include the variable resistance element VR and the select element SE.

The peripheral circuit section 30 may include a memory controller that operates the first memory cells of the first memory section 10. The memory controller may include a row decoder, a page buffer, an I/O buffer, a control logic, and/or a buffer RAM. In some embodiments, the buffer RAM may include a volatile memory device such as DRAM or SRAM.

Figure 7:
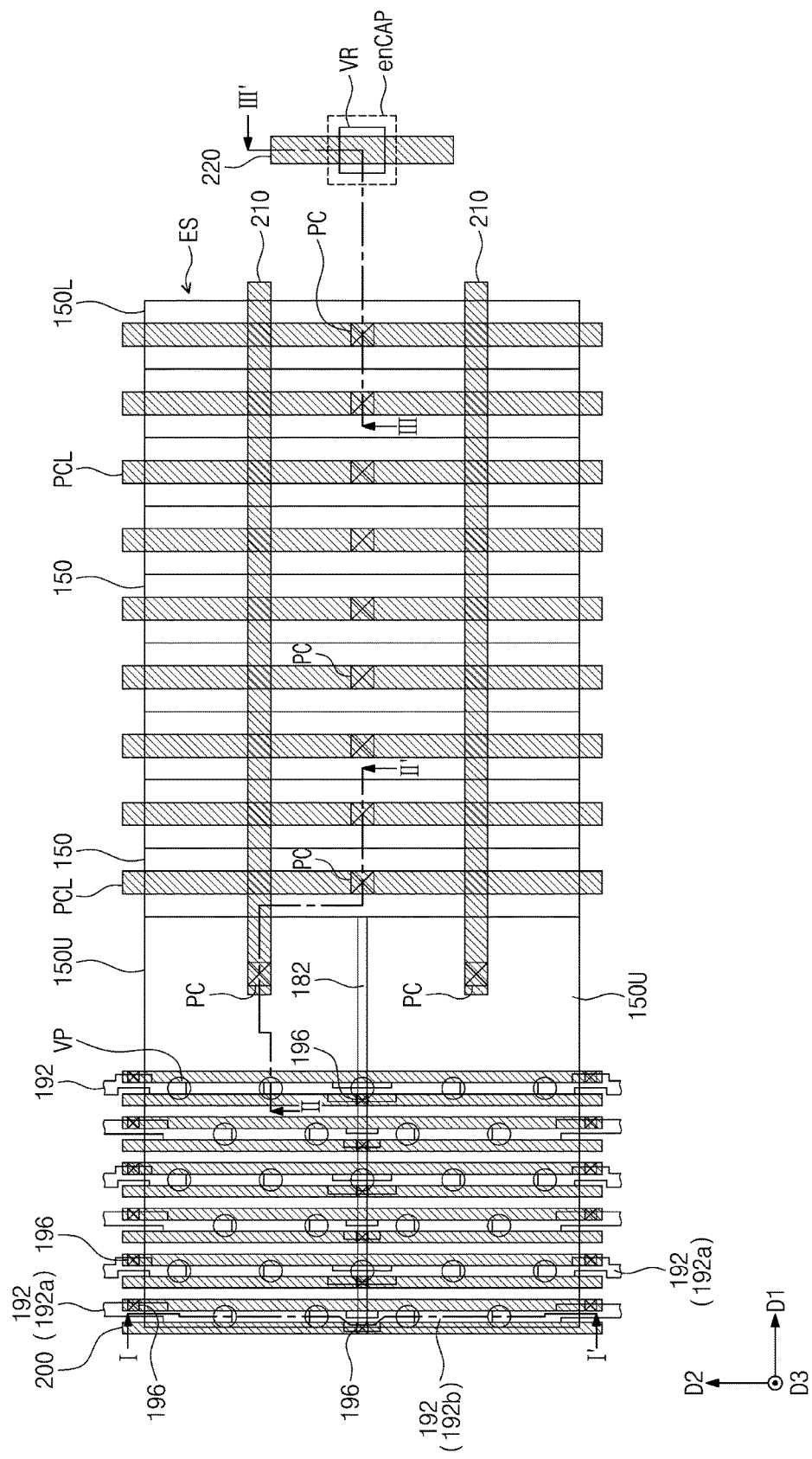
FIG. 7 illustrates a plan view of the semiconductor device of FIG. 6 according to example embodiments of the present inventive concepts.
Figure 8:
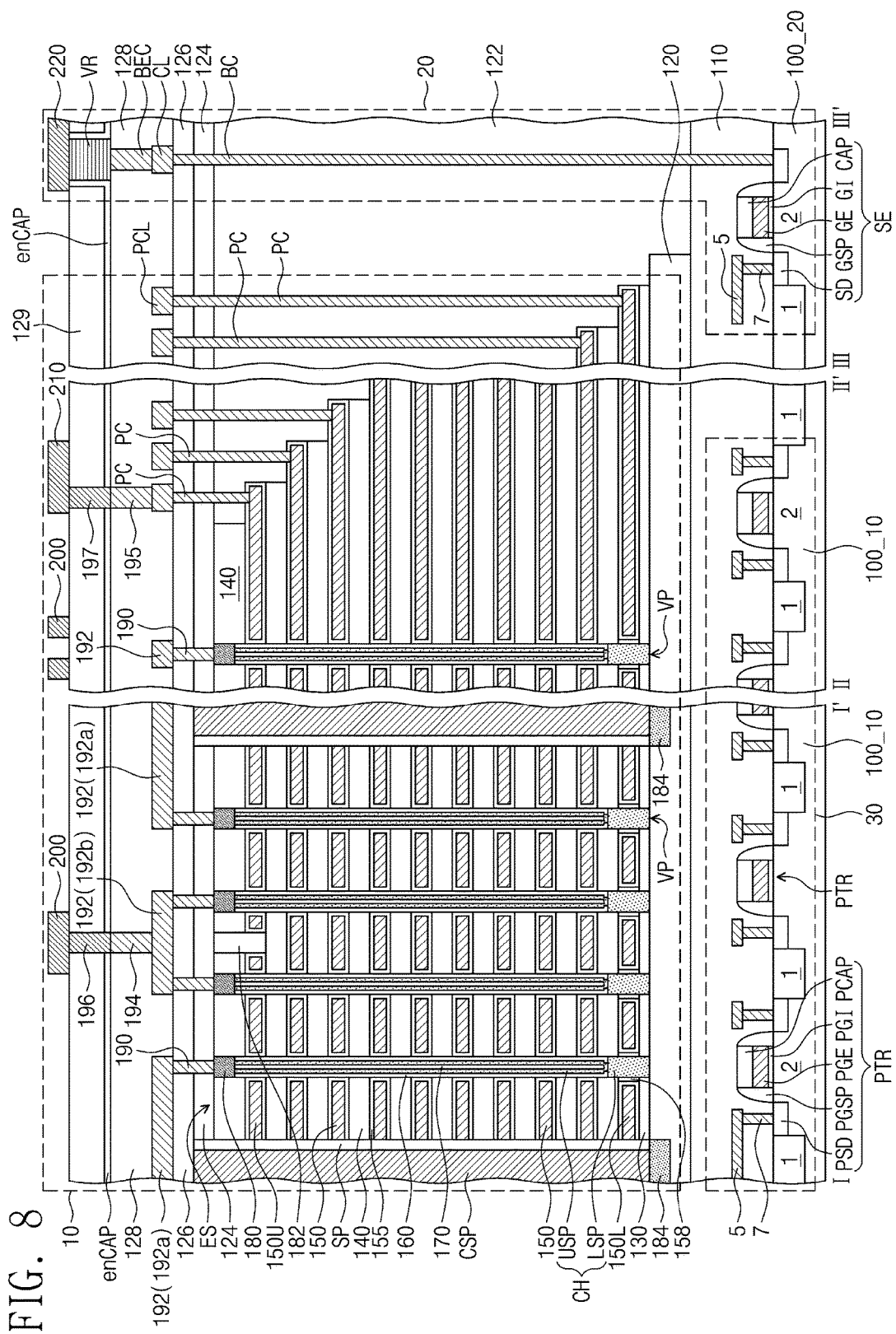
FIG. 8 illustrates cross-sectional views taken along the lines I-I', II-II', and III-III' of FIG. 7 according to example embodiments of the present inventive concepts.

FIG. 7 illustrates a plan view of the semiconductor device of FIG. 6 according to example embodiments of the present inventive concepts, and FIG. 8 illustrates cross-sectional views taken along the lines I-I', II-II', and III-III' of FIG. 7.

Referring to FIGS. 7 and 8, the substrate 100 may be provided with a device isolation layer 1 that defines active regions 2. The peripheral circuit section 30 may include peripheral transistors PTR disposed on the substrate 100. The peripheral transistors PTR may be, for example, field effect transistors. The peripheral transistors PTR may be configured to generate a signal for operation of the memory cell transistors MCT, MCT1, and MCT2 discussed with reference to FIGS. 2 to 4. Each of the peripheral transistors PTR may include a peripheral gate electrode PGE on the substrate 100, a peripheral gate dielectric patter PGI between the substrate 100 and the peripheral gate electrode PGE, a peripheral gate capping pattern PCAP on a top surface of the peripheral gate electrode PGE, peripheral gate spacers PGSP on sidewalls of the peripheral gate electrode PGE, and peripheral source/drain regions PSD in the active regions 2 on opposite sides of the peripheral gate electrode PGE.

The second memory section 20 may include the select element SE disposed on the substrate 100. The select element SE may be, for example, a field effect transistor. The select element SE may include a gate electrode GE on the substrate 100, a gate dielectric pattern GI between the substrate 100 and the gate electrode GE, a gate capping pattern CAP on a top surface of the gate electrode GE, gate spacers GSP on sidewalls of the gate electrode GE, and source/drain regions SD in the active regions 2 on opposite sides of the gate electrode GE. The peripheral transistors PTR and the select element SE may be provided at substantially the same level. For example, the select element SE may be positioned at substantially the same height from the substrate 100 as those of the peripheral transistors PTR. In some embodiments, as illustrated in FIG. 8, lower surfaces of the peripheral gate electrodes PGE may be at substantially the same level as a lower surface of the gate electrode GE, and the top surfaces of the peripheral gate electrodes PGE may be at substantially the same level as the top surface of the gate electrode GE.

In some embodiments, the peripheral transistors PTR and the select element SE may have substantially the same structure, may include the same materials, and may be formed using the same formation method. For example, the peripheral gate electrode PGE, the peripheral gate dielectric pattern PGI, the peripheral gate capping pattern PCAP, the peripheral gate spacers PGSP, and the peripheral source/drain regions PSD may be substantially the same respectively as the gate electrode GE, the gate dielectric pattern GI, the gate capping pattern CAP, the gate spacers GSP, and the source/drain regions SD, in terms of their structures, their materials, and their formation methods. The peripheral gate electrode PGE and the gate electrode GE may include the same conductive material. The peripheral gate dielectric pattern PGI, the peripheral gate capping pattern PCAP, the peripheral gate spacers PGSP, the gate dielectric pattern GI, the gate capping pattern CAP, and the gate spacers GSP may include an oxide layer, a nitride layer, and/or an oxynitride layer. The peripheral source/drain regions PSD and the source/drain regions SD may be impurity-doped regions provided in the substrate 100.

Lower wirings 5 and lower wiring contacts 7 may be provided on the substrate 100. The peripheral transistors PTR may be electrically connected to corresponding lower wirings 5 and lower wiring contacts 7. The peripheral transistors PTR, the corresponding lower wirings 5, and the corresponding lower wiring contacts 7 may constitute the memory controller that operates the first memory cells of the first memory section 10. One terminal of the select element SE (for example, one of the source/drain regions SD) may be electrically connected to a corresponding one of the lower wirings 5 and to a corresponding one of the lower wiring contacts 7.

The peripheral transistors PTR and the select element SE may be covered with a lower interlayer dielectric layer 110 provided on the substrate 100. The peripheral circuit section 30 may include the corresponding lower wirings 5 and the corresponding lower wiring contacts 7, which are electrically connected to the peripheral transistors PTR, and may further include a portion of the lower interlayer dielectric layer 110 covering the peripheral transistors PTR. The second memory section 20 may include the corresponding lower wirings 5 and the corresponding lower wiring contact 7, which are electrically connected to the select element SE, and may further include another portion of the lower interlayer dielectric layer 110 covering the select element SE. The lower interlayer dielectric layer 110 may include an oxide layer, a nitride layer, and/or an oxynitride layer.

The first memory section 10 may include a semiconductor layer 120 on the lower interlayer dielectric layer 110. The semiconductor layer 120 may include a semiconductor material (e.g., silicon, germanium). The first memory cells may be three-dimensionally arranged on the semiconductor layer 120. In some embodiments, the select element SE may be disposed lower than the semiconductor layer 120, as illustrated in FIG. 8, and the select element SE may be closer to the substrate 100 than the semiconductor layer 120.

The first memory section 10 may include a three-dimensional NAND flash memory cell structure provided on the semiconductor layer 120. For example, an electrode structure ES may be provided on the semiconductor layer 120. The electrode structure ES may include gate electrodes 150L, 150, and 150U sequentially stacked on the semiconductor layer 120 and may also include insulating layers 140 between the gate electrodes 150L, 150, and 150U. The gate electrodes 150L, 150, and 150U and the insulating layers 140 may be alternately and repeatedly stacked on the semiconductor layer 120. The insulating layers 140 may electrically insulate the gate electrodes 150L, 150, and 150U from each other. The electrode structure ES may extend in the first direction D1 and may have a stepwise structure at its end portion. For example, each of the gate electrodes 150L, 150, and 150U may extend in the first direction D1 and may have an exposed end portion that is not covered by its overlying one of the gate electrodes 150L, 150, and 150U. A topmost one of the gate electrodes 150L, 150, and 150U may include a pair of uppermost gate electrodes 150U horizontally spaced apart from each other. The pair of uppermost gate electrodes 150U may be separated from each other by a separation insulating pattern 182 that extends in the first direction D1 between the pair of uppermost gate electrodes 150U. A buffer insulating layer 130 may be interposed between the semiconductor layer 120 and a lowermost gate electrode 150L. The buffer insulating layer 130 may be thinner than each of the insulating layers 140, as illustrated in FIG. 8. The insulating layers 140 and the buffer insulating layer 130 may include an insulating material (e.g., a silicon oxide layer). The gate electrodes 150L, 150, and 150U may include metal and/or metal nitride. The separation insulating pattern 182 may include an insulating material (e.g., a silicon oxide layer).

A plurality of vertical patterns VP that penetrate the electrode structure ES may be provided on the semiconductor layer 120. Each of the vertical patterns VP may penetrate (e.g., extend through) the electrode structure ES and may be in contact with the semiconductor layer 120. In a plan view, the vertical patterns VP may be arranged in a zigzag pattern along the first direction D1. Each of the vertical patterns VP may include a channel structure CH that protrudes upward from the semiconductor layer 120. For example, the channel structure CH may include a lower semiconductor pattern LSP, which penetrates a lower portion of the electrode structure ES and is connected to the semiconductor layer 120, and an upper semiconductor pattern USP, which penetrates an upper portion of the electrode structure ES and is connected to the lower semiconductor pattern LSP. The upper semiconductor pattern USP may have a hollow pipe shape or a macaroni shape. The lower semiconductor pattern LSP may include a semiconductor material whose conductivity type is the same as that of a semiconductor material of the semiconductor layer 120. The lower semiconductor pattern LSP may be an epitaxial pattern formed (e.g., grown) using the semiconductor layer 120 as a seed. The lower semiconductor pattern LSP may have a pillar shape that protrudes from the semiconductor layer 120. Of the gate electrodes 150L, 150, and 150U, the lowermost gate electrode 150L may be on a side the lower semiconductor pattern LSP, and the other gate electrodes 150 and 150L may be on a side of the upper semiconductor pattern USP.

Each of the vertical patterns VP may include a buried insulating pattern 170 that fills an inside of the upper semiconductor pattern USP and a vertical insulator 160 that lies between the upper semiconductor pattern USP and the electrode structure ES. The buried insulating pattern 170 may include, for example, silicon oxide. The vertical insulator 160 may have a macaroni shape or a pipe shape whose top and bottom ends are opened. The vertical insulator 160 may have a bottom surface in contact with the lower semiconductor pattern LSP. The vertical insulator 160 may include a memory element of flash memory devices. In some embodiments, the vertical insulator 160 may include a charge storage layer of flash memory devices. The vertical insulator 160 may include a charge storage layer and a tunnel insulating layer sequentially stacked. The tunnel insulating layer may be in direct contact with the upper semiconductor pattern USP, and the charge storage layer may be interposed between the tunnel insulating layer and the gate electrodes 150 and 150U. The vertical insulator 160 may further include a blocking insulating layer between the charge storage layer and the gate electrodes 150 and 150U.

A gate dielectric pattern 158 may be disposed between the lower semiconductor pattern LSP and the lowermost gate electrode 150L. The gate dielectric pattern 158 may include, for example, a silicon oxide layer. Horizontal insulators 155 may be provided on top and bottom surfaces of each of the gate electrodes 150L, 150, and 150U. Each of the horizontal insulators 155 may extend between the vertical insulator 160 and each of the gate electrodes 150 and 150U, or between the gate dielectric pattern 158 and the lowermost gate electrode 150L. The horizontal insulators 155 may include a blocking insulating layer of charge trap-type flash memory transistors.

Conductive pads 180 may be correspondingly provided on the vertical patterns VP. Each of the conductive pads 180 may be electrically connected to the channel structure CH. The electrode structure ES may be disposed between common source regions 184 adjacent to each other. The common source regions 184 may be provided in the semiconductor layer 120 on opposite sides of the electrode structure ES and may extend in the first direction D1. The common source regions 184 may be a source region of the memory cell transistors (e.g., MCT, MCT1, and MCT2 of FIGS. 2 to 4) included in the electrode structure ES. Side insulating spacers SP may be provided on opposite side surfaces of the electrode structure ES. The side insulating spacers SP may include, for example, silicon nitride. Common source plugs CSP may be provided on opposite sides of the electrode structure ES and may be connected to the corresponding common source regions 184. The common source plugs CSP may extend in the first direction D1 and may be spaced apart from each other in the second direction D2. The side insulating spacers SP may be correspondingly interposed between the electrode structure ES and each of the common source plugs CSP. The common source plugs CSP may include a conductive material.

A first capping insulating layer 122 may cover the step-wise-shaped end portion of the electrode structure ES. The first capping insulating layer 122 may penetrate the semiconductor layer 120 and may be in contact with the lower interlayer dielectric layer 110. The first capping insulating layer 122 may have a top surface coplanar with a top surface of the electrode structure ES. For example, the top surface of the first capping insulating layer 122 may be coplanar with a top surface of an uppermost insulating layer 140 of the electrode structure ES. A second capping insulating layer 124 may be provided on the electrode structure ES and may cover the top surface of the electrode structure ES and top surfaces of the conductive pads 180. The second capping insulating layer 124 may extend along the top surface of the first capping insulating layer 122. The first and second capping insulating layers 122 and 124 may include an insulating material (e.g., silicon oxide). A first interlayer dielectric layer 126 may be provided on the second capping insulating layer 124 and may cover top surfaces of the common source plugs CSP.

Lower contacts 190 may be correspondingly provided on the conductive pads 180. Each of the lower contacts 190 may penetrate the first interlayer dielectric layer 126 and the second capping insulating layer 124 and may be electrically connected to a corresponding one of the conductive pads 180. The lower contacts 190 may include a conductive material.

Subsidiary conductive lines 192 may be provided on the first interlayer dielectric layer 126. The subsidiary conductive lines 192 may be arranged along the first and second directions D1 and D2 on the first interlayer dielectric layer 126. The subsidiary conductive lines 192 may each have a bar shape having a longitudinal axis in the second direction D2. The subsidiary conductive lines 192 may include first subsidiary conductive lines 192a and second subsidiary conductive lines 192b. On the electrode structure ES, each of the first subsidiary conductive lines 192a may cross over a corresponding one of the common source plugs CSP (or of the common source regions 184), and each of the second subsidiary conductive lines 192b may cross over the separation insulating pattern 182. The subsidiary conductive lines 192 may be electrically connected, through the lower contacts 190, to the vertical patterns VP. Each of the first subsidiary conductive lines 192a may electrically connect a corresponding one of the vertical patterns VP to a corresponding one of vertical patterns VP included in a neighboring electrode structure ES. Although not shown, the neighboring electrode structure ES may be spaced apart from the electrode structure ES across one of the common source plugs CSP. Each of the second subsidiary conductive lines 192b may electrically connect a pair of vertical patterns VP to each other. The pair of vertical patterns VP may be spaced apart from each other across the separation insulating pattern 182 and may respectively penetrate the pair of uppermost gate electrodes 150U. The subsidiary conductive lines 192 may include a conductive material.

Still referring to FIG. 8, lower pad contacts PC may be correspondingly provided on the end portions of the gate electrodes 150L, 150, and 150U. The lower pad contacts PC may be electrically connected to corresponding gate electrodes 150L, 150, and 150U. Each of the lower pad contacts PC may penetrate the first interlayer dielectric layer 126, the second capping insulating layer 124, and at least a portion of the first capping insulating layer 122, and may be in contact with a corresponding one of the end portions of the gate electrodes 150L, 150, and 150U. A top surface of the first interlayer dielectric layer 126 may be coplanar with top surfaces of the lower pad contacts PC and top surfaces of the lower contacts 190. The lower pad contacts PC may include a conductive material.

Lower pad lines PCL may be provided on the first interlayer dielectric layer 126. The lower pad lines PCL may be connected to corresponding lower pad contacts PC. The lower pad lines PCL may be connected, through corresponding lower pad contacts PC, to corresponding gate electrodes 150L, 150, and 150U. The lower pad lines PCL may extend in the second direction D2 and may be spaced apart from each other in the first direction D1. The lower pad lines PCL and the subsidiary conductive lines 192 may be positioned at substantially the same height from the substrate 100. The lower pad lines PCL may include the same material as those of the subsidiary conductive lines 192.

A second interlayer dielectric layer 128 may be provided on the first interlayer dielectric layer 126. The second interlayer dielectric layer 128 may cover the subsidiary conductive lines 192 and the lower pad lines PCL. A third interlayer dielectric layer 129 may be provided on the second interlayer dielectric layer 128. The first to third interlayer dielectric layers 126, 128, and 129 may include an insulating material (e.g., silicon oxide).

Bit lines 200 and upper pad lines 210 may be provided on the third interlayer dielectric layer 129. The bit lines 200 may extend in the second direction D2 and may be spaced apart from each other in the first direction D1. The bit lines 200 may be electrically connected to the subsidiary conductive lines 192 through upper contacts 196 and middle contacts 194. For example, the middle contacts 194 may be correspondingly provided on the subsidiary conductive lines 192. Each of the middle contacts 194 may penetrate the second interlayer dielectric layer 128 and may be connected to a corresponding one of the subsidiary conductive lines 192. The upper contacts 196 may be correspondingly provided on the middle contacts 194. Each of the upper contacts 196 may penetrate the third interlayer dielectric layer 129 and may be connected to a corresponding one of the middle contacts 194. Each of the upper contacts 196 may be connected to a corresponding one of the bit lines 200. The middle contacts 194, the upper contacts 196, and the bit lines 200 may include a conductive material.

The upper pad lines 210 may extend in the first direction D1 and may be spaced apart from each other in the second direction D2. The upper pad lines 210 may be electrically connected to a pair of the uppermost gate electrodes 150U, respectively. Each of the upper pad lines 210 may be electrically connected to a corresponding one of the pair of uppermost gate electrodes 150U through an upper pad contact 197 and a middle pad contact 195. The middle pad contact 195 may penetrate the second interlayer dielectric layer 128 and may be connected to a corresponding one of the lower pad lines PCL, and the upper pad contact 197 may penetrate the third interlayer dielectric layer 129 and may be connected to the middle pad contact 195. The upper pad contact 197 may be connected to a corresponding one of the upper pad lines 210.

The middle pad contact 195 and the middle contacts 194 may be positioned at substantially the same height from the substrate 100. Top surfaces of the middle pad contact 195, the middle contacts 194, and the second interlayer dielectric layer 128 may be substantially coplanar with each other, as illustrated in FIG. 8. The middle pad contact 195 may include the same material as those of the middle contacts 194. The upper pad contact 197 and the upper contacts 196 may be positioned at substantially the same height from the substrate 100. Top surfaces of the upper pad contact 197, the upper contacts 196, and the third interlayer dielectric layer 129 may be substantially coplanar with each other, as illustrated in FIG. 8. The upper pad contact 197 may include the same material as those of the upper contacts 196. The upper pad lines 210 and the bit lines 200 may be provided at substantially the same level from the substrate 100 and may include the same material as each other. Although not shown, the gate electrodes 150L, 150, and 150U may be electrically connected to a row decoder of the peripheral circuit section 30 through the lower pad contacts PC, the lower pad lines PCL, the middle pad contact 195, the upper pad contact 197, and the upper pad lines 210. The bit lines 200 may be electrically connected to a page buffer of the peripheral circuit section 30.

Still referring to FIG. 8, the second memory section 20 may include a variable resistance memory cell structure. For example, the second memory section 20 may include the variable resistance element VR provided on the lower interlayer dielectric layer 110. The second section 20 may include a portion of the first capping insulating layer 122, a portion of the second capping insulating layer 124, a portion of the first interlayer dielectric layer 126, and a portion of the second interlayer dielectric layer 128, which are interposed between the lower interlayer dielectric layer 110 and the variable resistance element VR. The variable resistance element VR may be provided on the second interlayer dielectric layer 128. The third interlayer dielectric layer 129 may have a portion, which is provided on the second interlayer dielectric layer 128 and covers the variable resistance element VR, included in the second section 20. The second memory section 20 may include a buried contact BC that penetrates the lower interlayer dielectric layer 110, the first capping insulating layer 122, the second capping insulating layer 124, and the first interlayer dielectric layer 126 and is connected to one terminal of the select element SE (e.g., a source/drain region). The buried contact BC may be a single conductive contact or a plurality of conductive contacts electrically connected to each other. The buried contact BC may have a top surface at substantially the same height from the substrate 100 as those of the top surfaces of the lower pad contacts PC and the top surfaces of the lower contacts 190 as illustrated in FIG. 8. The top surface of the first interlayer dielectric layer 126 may be substantially coplanar with the top surface of the buried contact BC, the top surfaces of the lower pad contacts PC, and the top surfaces of the lower contacts 190. The buried contact BC may include a conductive material.

The second memory section 20 may include a bottom electrode contact BEC provided on the first interlayer dielectric layer 126 and electrically connected to the buried contact BC. The second memory section 20 may include a conductive pattern CL between the bottom electrode contact BEC and the buried contact BC. In some embodiments, the conductive pattern CL may not be provided, and the bottom electrode contact BEC may directly contact the buried contact BC. The bottom electrode contact BEC may penetrate at least a portion of the second interlayer dielectric layer 128 and may be in contact with the variable resistance element VR. The bottom electrode contact BEC may be positioned at substantially the same height from the substrate 100 as those of the middle pad contact 195 and the middle contacts 194. The bottom electrode contact BEC may have a top surface substantially coplanar with the top surface of the middle pad contact 195, the top surfaces of the middle contacts 194, and the top surface of the second interlayer dielectric layer 128. The bottom electrode contact BEC may include the same material as those of the middle pad contact 195 and the middle contacts 194. The variable resistance element VR may be positioned at substantially the same height from the substrate 100 as those of the upper pad contact 197 and the upper contacts 196. The variable resistance element VR will be further discussed in detail below with reference to FIGS. 12A and 12B.

The second memory section 20 may include an interconnection line 220 provided on the third interlayer dielectric layer 129 and electrically connected to the variable resistance element VR. The interconnection line 220 may function as the bit line BL_20 connected to the memory cell MC as discussed with reference to FIG. 5. The interconnection line 220 may be provided at substantially the same level from the substrate 100 as those of the upper pad lines 210 and the bit lines 200, as illustrated in FIG. 8. The interconnection line 220 may include the same material (e.g., copper) as those of the upper pad lines 210 and the bit lines 200. According to the present embodiments, the variable resistance element VR may be disposed at a level between the bit lines 200 of the first memory section 10 and the subsidiary conductive lines 192 of the first memory section 10 as illustrated in FIG. 8.

Still referring to FIG. 8, in some embodiments, an encapsulating layer enCAP may be disposed on a side of the variable resistance element VR. The encapsulating layer enCAP may continuously extend from the side of the variable resistance element VR onto the first memory region 100_10 of the substrate 100 and may overlap the electrode structure ES of the memory section 10. The upper contacts 196 and the upper pad contact 197 may extend through the encapsulating layer enCAP. In some embodiments, the encapsulating layer enCAP may enclose the side of the variable resistance element VR in a plan view. In some embodiments, the encapsulating layer enCAP may completely enclose the side of the variable resistance element VR in a plan view, as illustrated in FIG. 7. For example, the encapsulating layer enCAP may include nitride and may include an aluminum nitride layer.

In some embodiments, the variable resistance element VR may be disposed higher than the pair of the uppermost gate electrodes 150U, as illustrated in FIG. 8. Specifically, a lower surface of the variable resistance element VR, which faces the substrate 100, may be higher than upper surfaces of the pair of the uppermost gate electrodes 150U.

It will be understood that "an interlayer dielectric layer" or "an interlayer insulating layer" refers to as a dielectric layer or an insulating layer that is interposed between a pair of conductive patterns of the semiconductor device 1000, which are spaced apart from each other in the vertical direction (e.g., the third direction D3). "An interlayer dielectric layer" or "an interlayer insulating layer" may be distinguished from an outermost package material of the semiconductor device 1000 (e.g., an epoxy plastic). For example, the pair of conductive patterns of the semiconductor device 1000, which are spaced apart from each other in the vertical direction, are the subsidiary conductive lines 192 and the bit lines 200 of the first memory section 10, and the conductive pattern CL and the interconnection line 220 of the second memory section 20. As illustrated in FIG. 8, each of the first, second and third interlayer dielectric layers 126, 128 and 129 may extend continuously on the first memory region 100_10 and the second memory region 100_20 and may overlap both the electrode structure ES of the first memory section 10 and the select element SE of the second memory section 20. In some embodiments, each of the first, second and third interlayer dielectric layers 126, 128 and 129 that includes portions overlapping the first memory region 100_10 and the second memory region 100_20 may be formed using a single deposition process and thus may have a unitary structure.

Figure 9:
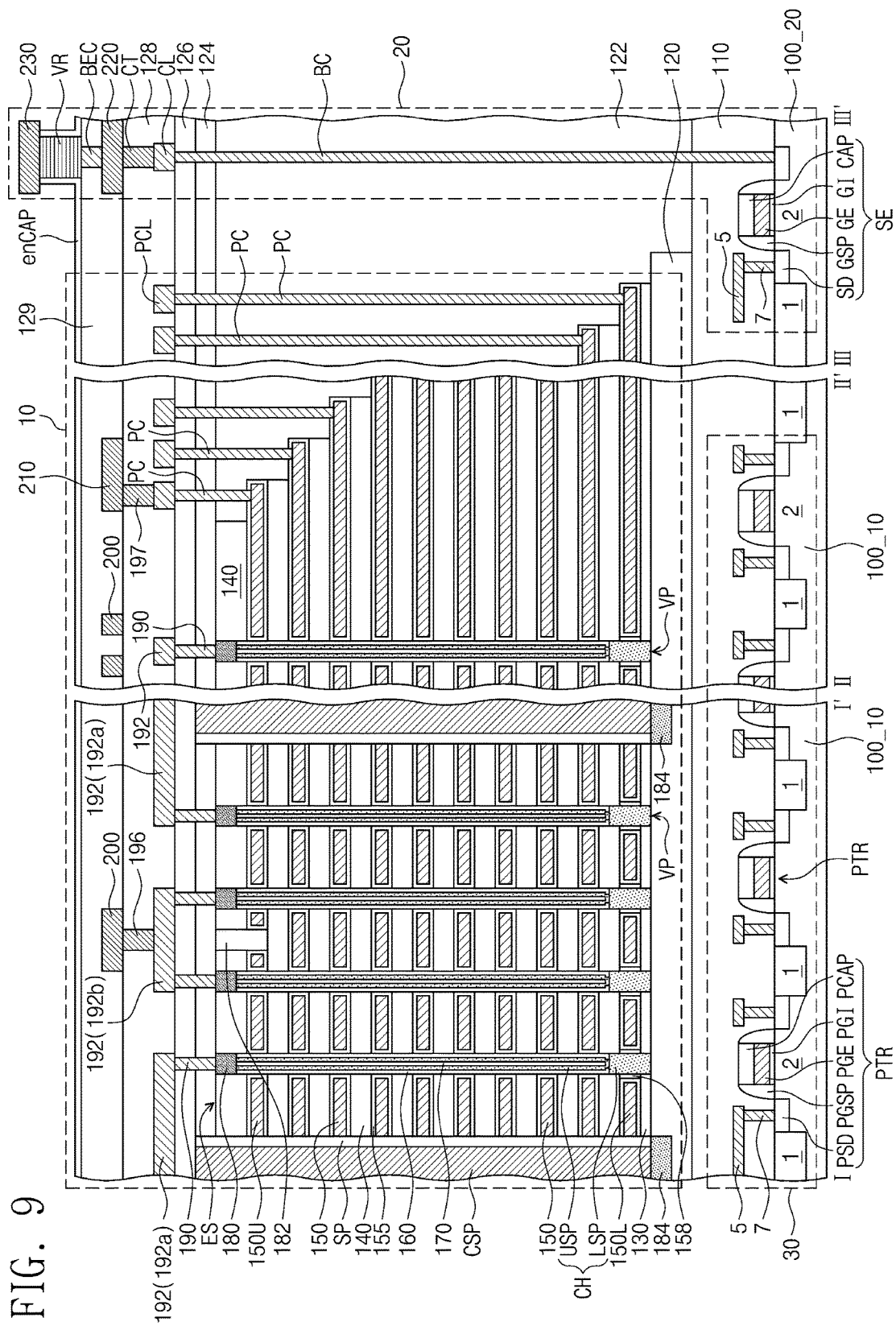
FIG. 9 illustrates cross-sectional views taken along the lines I-I', II-II', and III-III' of FIG. 7 according to example embodiments of the present inventive concepts.

FIG. 9 illustrates cross-sectional views taken along the lines I-I', II-II', and III-III' of FIG. 7 according to example embodiments of the present inventive concepts.

Referring to FIGS. 7 and 9, the subsidiary conductive lines 192 and the lower pad lines PCL may be provided on the first interlayer dielectric layer 126 of the first memory section 10. The second interlayer dielectric layer 128 may be provided on the first interlayer dielectric layer 126 of the first memory section 10 and may cover the subsidiary conductive lines 192 and the lower pad lines PCL. The bit lines 200 and the upper pad lines 210 may be provided on the second interlayer dielectric layer 128. The bit lines 200 may be electrically connected, through the upper contacts 196, to the subsidiary conductive lines 192. Each of the upper contacts 196 may be in contact with a corresponding one of the subsidiary conductive lines 192. In some embodiments, middle contacts 194 discussed with reference to FIGS. 7 and 8 may be omitted, and the upper contact 196 may directly contact the corresponding subsidiary conductive line 192 as illustrated in FIG. 9. Each of the upper pad lines 210 may be electrically connected, through the upper pad contact 197, to a corresponding one of the pair of uppermost gate electrodes 150U. The upper pad contact 197 may be in contact with a corresponding one of the lower pad lines PCL. In some embodiments, middle pad contact 195 discussed with reference to FIGS. 7 and 8 may be omitted, and the upper pad contact 197 may directly contact the corresponding lower pad line PCL as illustrated in FIG. 9. The third interlayer dielectric layer 129 that covers top surfaces of the bit lines 200 and top surfaces of the upper pad lines 210 may be formed on the second interlayer dielectric layer 128.

Still referring to FIG. 9, the second memory section 20 may include the variable resistance element VR provided on the lower interlayer dielectric layer 110. The second section 20 may include a portion of the first capping insulating layer 122, a portion of the second capping insulating layer 124, and portions of the first to third interlayer dielectric layers 126, 128, and 129, which are interposed between the lower interlayer dielectric layer 110 and the variable resistance element VR. According to the present embodiments, the variable resistance element VR may be provided on the third interlayer dielectric layer 129 as illustrated in FIG. 9. The second memory section 20 may include the buried contact BC that penetrates the lower interlayer dielectric layer 110, the first capping insulation layer 122, the second capping insulation layer 124, and the first interlayer dielectric layer 126 and is connected to one terminal of the select element SE. The second memory section 20 may include a conductive contact CT provided on the first interlayer dielectric layer 126 and electrically connected to the buried contact BC. The second memory section 20 may include the conductive pattern CL between the conductive contact CT and the buried contact BC. In some embodiments, the conductive pattern CL may not be provided. The conductive contact CT may be positioned at substantially the same height from the substrate 100 as those of the upper pad contact 197 and the upper contacts 196. The conductive contact CT may have a top surface substantially coplanar with the top surface of the upper pad contact 197, the top surfaces of the upper contacts 196, and the top surface of the second interlayer dielectric layer 128. The conductive contact CT may include the same material as those of the upper pad contact 197 and the upper contacts 196.

The second memory section 20 may include the interconnection line 220 provided on the second interlayer dielectric layer 128 and electrically connected to the conductive contact CT. The interconnection line 220 may be positioned at substantially the same height from the substrate 100 as those of the upper pad lines 210 and the bit lines 200. The interconnection line 220 may include the same material as those of the upper pad lines 210 and the bit lines 200. The third interlayer dielectric layer 129 may cover top surfaces of the interconnection line 220, the bit lines 200, and the upper pad lines 210. The second memory section 20 may include the variable resistance element VR provided on the third interlayer dielectric layer 129. The bottom electrode contact BEC may penetrate at least a portion of the third interlayer dielectric layer 129 between the variable resistance element VR and the interconnection line 220. The bottom electrode contact BEC may include a conductive material (e.g., tungsten).

In some embodiments, an encapsulating layer enCAP may be disposed on the third interlayer dielectric layer 129. The encapsulating layer enCAP may extend on a side of the variable resistance element VR and may continuously extend from the side of the variable resistance element VR onto the first memory region 100_10 of the substrate 100 to overlap the electrode structure ES of the memory section 10 as illustrated in FIG. 9. The second memory section 20 may include an additional interconnection line 230 connected to an upper portion of the variable resistance element VR. The additional interconnection line 230 may function as the bit line BL_20 connected to the memory cell MC discussed with reference to FIG. 5. The additional interconnection line 230 may include a conductive material (e.g., copper). According to the present embodiments, the variable resistance element VR may be positioned higher than the bit line 200 of the first memory section 10 as illustrated in FIG. 9.

Figure 10:
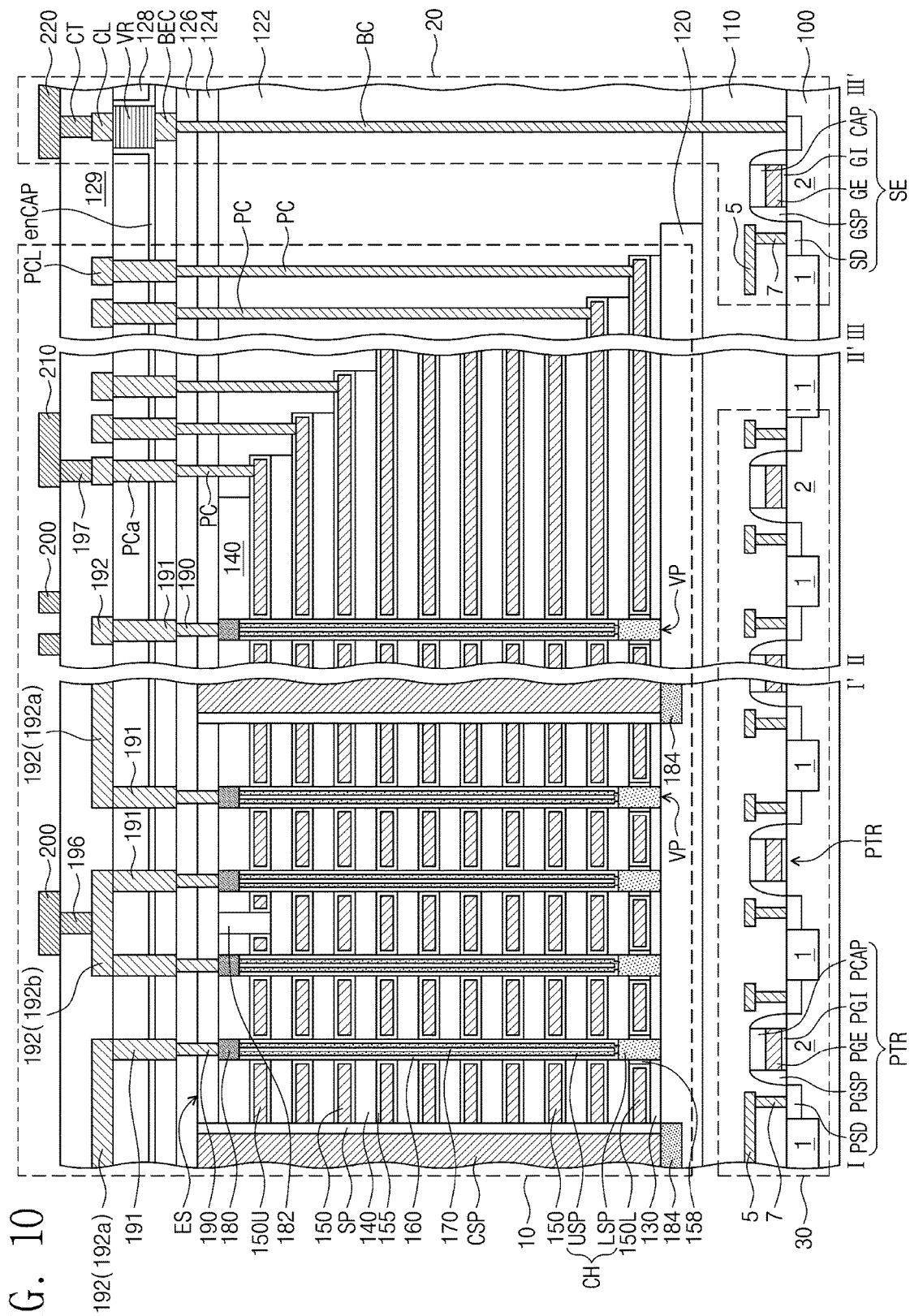
FIG. 10 illustrates a cross-sectional views taken along the lines I-I', II-II', and III-III' of FIG. 7 according to example embodiments of the present inventive concepts.

FIG. 10 illustrates cross-sectional views taken along the lines I-I', II-II', and III-III' of FIG. 7 according to example embodiments of the present inventive concepts.

Referring to FIGS. 7 and 10, the second interlayer dielectric layer 128 may be provided on the first interlayer dielectric layer 126 of the first memory section 10. The second interlayer dielectric layer 128 may cover the top surfaces of the lower contacts 190 and the top surfaces of the lower pad contacts PC. The first memory section 10 may include subsidiary lower contacts 191 and subsidiary lower pad contacts PCa on the first interlayer dielectric layer 126. The subsidiary lower contacts 191 and the subsidiary lower pad contacts PCa may be provided in the second interlayer dielectric layer 128. The subsidiary lower contacts 191 may be correspondingly provided on the lower contacts 190. Each of the subsidiary lower contacts 191 may penetrate the second interlayer dielectric layer 128 and may be connected to a corresponding one of the lower contacts 190. The subsidiary lower pad contacts PCa may be correspondingly provided on the lower pad contacts PC. Each of the subsidiary lower pad contacts PCa may penetrate the second interlayer dielectric layer 128 and may be connected to a corresponding one of the lower pad contacts PC. The subsidiary lower pad contacts PCa and the subsidiary lower contacts 191 may be positioned at substantially the same height from the substrate 100. The subsidiary lower contacts 191 and the subsidiary lower pad contacts PCa may have their top surfaces that are substantially coplanar with the top surface of the second interlayer dielectric layer 128. The subsidiary lower contacts 191 and the subsidiary lower pad contacts PCa may include the same conductive material.

The subsidiary conductive lines 192 and the lower pad lines PCL may be provided on the second interlayer dielectric layer 128. The subsidiary conductive lines 192 may be electrically connected to the vertical patterns VP through the subsidiary lower contacts 191 and the lower contacts 190. Each of the subsidiary lower contacts 191 may electrically connect a corresponding one of the subsidiary conductive lines 192 to a corresponding one of the lower contacts 190. The lower pad lines PCL may be connected, through the subsidiary lower pad contacts PCa, to the lower pad contacts PC. Each of the lower pad lines PCL may be connected to a corresponding one of the gate electrodes 150L, 150, and 150U through a corresponding one of the subsidiary lower pad contacts PCa and a corresponding one of the lower pad contacts PC. The third interlayer dielectric layer 129 that covers the subsidiary conductive lines 192 and the lower pad lines PCL may be provided on the second interlayer dielectric layer 128. The bit lines 200 and the upper pad lines 210 may be provided on the third interlayer dielectric layer 129. The bit lines 200 may be electrically connected, through the upper contacts 196, to the subsidiary conductive lines 192. Each of the upper contacts 196 may penetrate the third interlayer dielectric layer 129 and may be in contact with a corresponding one of the subsidiary conductive lines 192.

Each of the upper pad lines 210 may be electrically connected, through the upper pad contact 197, to a corresponding one of the pair of uppermost gate electrodes 150U. The upper pad contact 197 may penetrate the third interlayer dielectric layer 129 and may be in contact with a corresponding one of the lower pad lines PCL.

The second memory section 20 may include the variable resistance element VR provided on the lower interlayer dielectric layer 110. The second section 20 may include a portion of the first capping insulating layer 122, a portion of the second capping insulating layer 124, and portions of the first and second interlayer dielectric layers 126 and 128, which are interposed between the lower interlayer dielectric layer 110 and the variable resistance element VR. The second memory section 20 may include the buried contact BC that penetrates the lower interlayer dielectric layer 110, the first capping insulating layer 122, the second capping insulating layer 124, and the first interlayer dielectric layer 126 and is connected to one terminal of the select element SE. The second memory section 20 may include the bottom electrode contact BEC provided on the first interlayer dielectric layer 126 and electrically connected to the buried contact BC. The bottom electrode contact BEC may be provided between the buried contact BC and the variable resistance element VR. According to the present embodiments, the bottom electrode contact BEC may be in contact with the variable resistance element VR and the buried contact BC, as illustrated in FIG. 10. The bottom electrode contact BEC may include a conductive material (e.g., tungsten). The bottom electrode contact BEC may penetrate a lower portion of the second interlayer dielectric layer 128, and the variable resistance element VR may penetrate an upper portion of the second interlayer dielectric layer 128.

According to the present embodiments, the variable resistance element VR may have a top surface substantially coplanar with the top surface of the second interlayer dielectric layer 128. The variable resistance element VR may be positioned at substantially the same height from the substrate 100 as those of the subsidiary lower contacts 191 and the subsidiary lower pad contacts PCa. The top surface of the variable resistance element VR may be positioned at substantially the same height as those of the top surfaces of the subsidiary lower contacts 191 and the top surfaces of the subsidiary lower pad contacts PCa.

In some embodiments, an encapsulating layer enCAP may be formed in the second interlayer dielectric layer 128, between the lower portion of the second interlayer dielectric layer 128 and the upper portion of the second interlayer dielectric layer 128. The subsidiary lower contacts 191 and the subsidiary lower pad contacts PCa may extend through the encapsulating layer enCAP, as illustrated in FIG. 10.

The second memory section 20 may include the conductive pattern CL and the conductive contact CT sequentially stacked on the second interlayer dielectric layer 128. The conductive pattern CL and the conductive contact CT may be electrically connected to the variable resistance element VR. According to the present embodiments, the conductive pattern CL may be provided at substantially the same level from the substrate 100 as those of the subsidiary conductive lines 192 and the lower pad lines PCL, as illustrated in FIG. 10, and may include the same material as those of the subsidiary conductive lines 192 and the lower pad lines PCL. The conductive contact CT may be provided at substantially the same level from the substrate 100 as those of the upper contacts 196 and the upper pad contact 197, as illustrated in FIG. 10, and may include the same material as those of the upper contacts 196 and the upper pad contact 197. The third interlayer dielectric layer 129 may have a portion, which is provided on the second interlayer dielectric layer 128 and covers the conductive pattern CL and the conductive contact CT, included in the second memory section 20. The second memory section 20 may include the interconnection line 220 provided on the third interlayer dielectric layer 129 and electrically connected to the conductive contact CT. According to the present embodiments, the variable resistance element VR may be positioned at a height less than those of the subsidiary conductive lines 192 of the first memory section 10. In some embodiments, the top surface of the variable resistance element VR may be disposed closer to the substrate 100 than the top surfaces of the subsidiary conductive lines 192 of the first memory section 10, as illustrated in FIG. 10.

Figure 11:
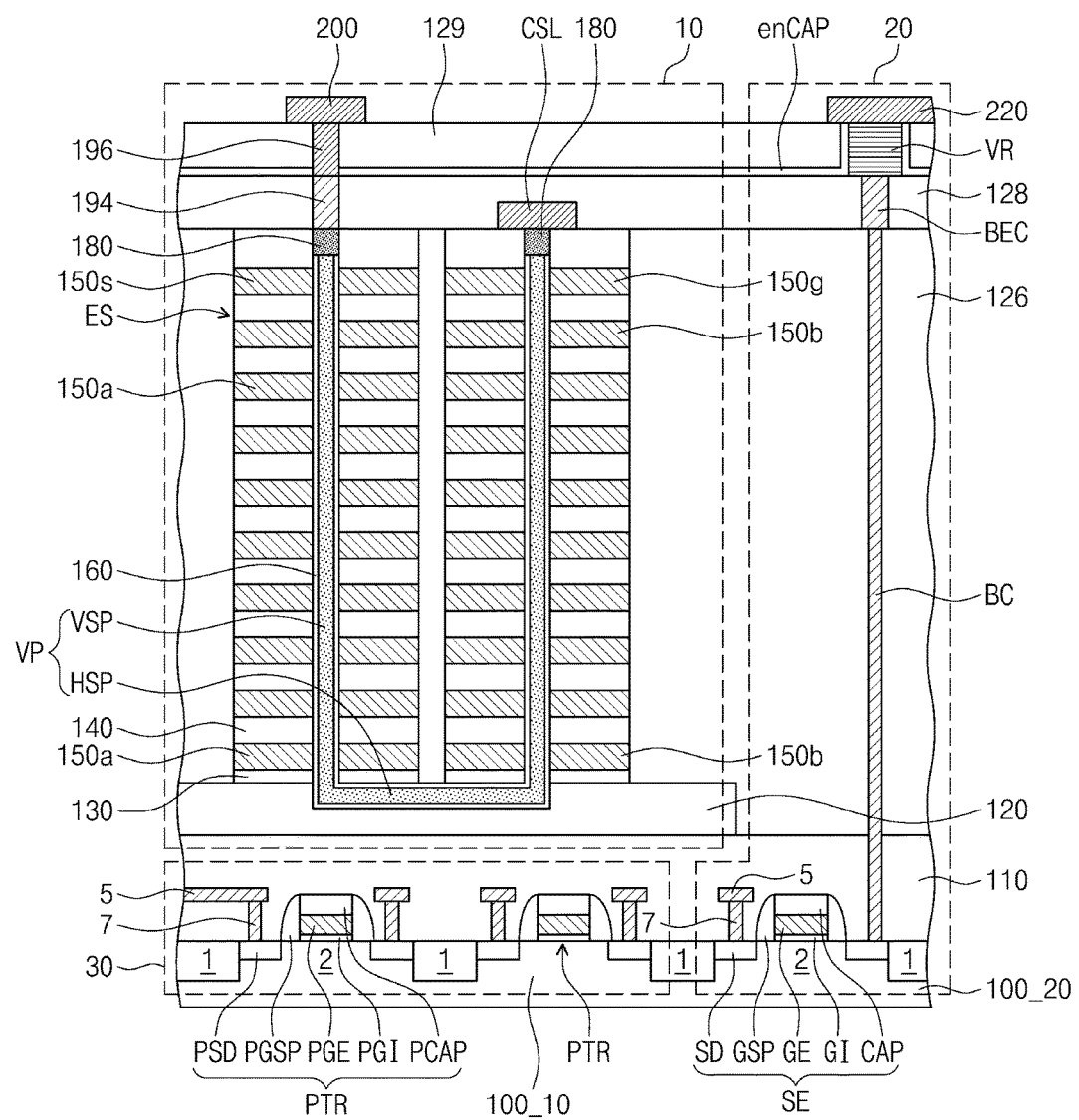
FIG. 11 illustrates a cross-sectional view of the semiconductor device of FIG. 6 according to example embodiments of the present inventive concepts.

FIG. 11 illustrates a cross-sectional view of the semiconductor device of FIG. 6 according to example embodiments of the present inventive concepts.

Referring to FIG. 11, the first memory section 10 may include a three-dimensional NAND flash memory cell structure provided on the semiconductor layer 120. For example, the bit line 200 may be provided on the semiconductor layer 120, and the electrode structure ES may be provided between the semiconductor layer 120 and the bit line 200. The common source line CSL may be provided at a level between that of the electrode structure ES and that of the bit line 200. The vertical pattern VP may penetrate the electrode structure ES and electrically connect the bit line 200 to the common source line CSL. The electrode structure ES may include a plurality of cell gate electrodes 150a and 150b, which are sequentially stacked on the semiconductor layer 120, and select gate electrodes, which are on the cell gate electrodes 150a and 150b. The select gate electrodes may include a string select gate electrode 150s, which is between the bit line 200 and the cell gate electrodes 150a and 150b, and a ground select gate electrode 150g, which is between the common source line CSL and the cell gate electrodes 150a and 150b. The string select gate electrode 150s may be horizontally spaced apart from the ground select gate electrode 150g. The cell gate electrodes 150a and 150b may include upper gate electrodes 150a, which are between the semiconductor layer 120 and the string select gate electrode 150s, and lower gate electrodes 150b, which are between the semiconductor layer 120 and the ground select gate electrode 150g. A group of the upper gate electrodes 150a may be horizontally spaced apart from a group of the lower gate electrodes 150b.

The vertical pattern VP may include a pair of vertical semiconductor patterns VSP, which penetrate the electrode structure ES, and a horizontal semiconductor pattern HSP, which is below the electrode structure ES and connects the pair of vertical semiconductor patterns VSP to each other. One of the pair of vertical semiconductor patterns VSP may penetrate the electrode structure ES and may be connected to the common source line CSL, and the other of the pair of vertical semiconductor patterns VSP may penetrate the electrode structure ES and may be connected to the bit line 200. The horizontal semiconductor pattern HSP may be provided between the semiconductor layer 120 and the electrode structure ES and may connect the pair of vertical semiconductor patterns VSP to each other. One of the pair of vertical semiconductor patterns VSP may penetrate the lower gate electrodes 150b and the ground select gate electrode 150g and may be electrically connected to the common source line CSL, and the other of the pair of vertical semiconductor patterns VSP may penetrate the upper gate electrodes 150a and the string select gate electrode 150s and may be electrically connected to the bit line 200. The horizontal semiconductor pattern HSP may extend to below the lower gate electrodes 150b from below the upper gate electrodes 150a to thereby connect the pair of vertical semiconductor patterns VSP to each other.

The vertical insulator 160 may be interposed between the electrode structure ES and the vertical pattern VP. The vertical insulator 160 may extend between the vertical pattern VP and the semiconductor layer 120. The vertical insulator 160 may include a tunnel insulating layer, a charge storage layer, and a blocking insulating layer that are sequentially stacked on an outer surface of the vertical pattern VP. The conductive pads 180 may be correspondingly provided on the pair of vertical semiconductor patterns VSP. The conductive pads 180 may be electrically connected to the vertical pattern VP. The semiconductor layer 120 may be provided therein with the back gate transistor BGT discussed with reference to FIG. 4, which selectively controls a current flow passing through the horizontal semiconductor pattern HSP of the vertical pattern VP. The lower interlayer dielectric layer 110 may be provided thereon with the first interlayer dielectric layer 126 that covers the semiconductor layer 120 and the electrode structure ES. The common source line CSL may be provided on the first interlayer dielectric layer 126 and may be electrically connected, through a corresponding one of the conductive pads 180, to one of the pair of vertical semiconductor patterns VSP.

The middle contact 194 may be provided on the first interlayer dielectric layer 126 and may be electrically connected through a corresponding one of the conductive pads 180 to the other of the pair of vertical semiconductor patterns VSP. The first interlayer dielectric layer 126 may be provided thereon with the second interlayer dielectric layer 128 that covers the common source line CSL and the middle contact 194. The second interlayer dielectric layer 128 may be provided thereon with the upper contact 196 connected to the middle contact 194. The second interlayer dielectric layer 128 may be provided thereon with the third interlayer dielectric layer 129 that covers the upper contact 196. The third interlayer dielectric layer 129 may be provided thereon with the bit line 200 electrically connected, through the upper and middle contacts 196 and 194, to the vertical pattern VP.

The second memory section 20 may include the variable resistance element VR provided on the lower interlayer dielectric layer 110. The first and second interlayer dielectric layers 126 and 128 may have their portions, which are interposed between the lower interlayer dielectric layer 110 and the variable resistance element VR, included in the second memory section 20. The second memory section 20 may include the buried contact BC that penetrates the lower interlayer dielectric layer 110 and the first interlayer dielectric layer 126 and is connected to one terminal of the select element SE. The second memory section 20 may include the bottom electrode contact BEC that penetrates the second interlayer dielectric layer 128 and is electrically connected to the buried contact BC. The variable resistance element VR may be provided on the second interlayer dielectric layer 128 and electrically connected to the bottom electrode contact BEC.

The third interlayer dielectric layer 129 may have a portion, which is provided on the second interlayer dielectric layer 128 and covers the variable resistance element VR, which is included in the second section 20. The second memory section 20 may include the interconnection line 220 provided on the third interlayer dielectric layer 129 and may be electrically connected to the variable resistance element VR. According to the present embodiments, the variable resistance element VR may be positioned at substantially the same height from the substrate 100 as that of the upper contact 196 of the first memory section 10, but the present inventive concepts are not limited thereto. In some embodiments, an encapsulating layer enCAP may be disposed on the second interlayer dielectric layer 128. The encapsulating layer enCAP may be disposed on a side of the variable resistance element VR and may continuously extend from the side of the variable resistance element VR onto first memory region 100_10 of the substrate 100 to overlap the electrode structure ES of the memory section 10. The upper contacts 196 may extend through the encapsulating layer enCAP, as illustrated in FIG. 11.

Figure 12A:
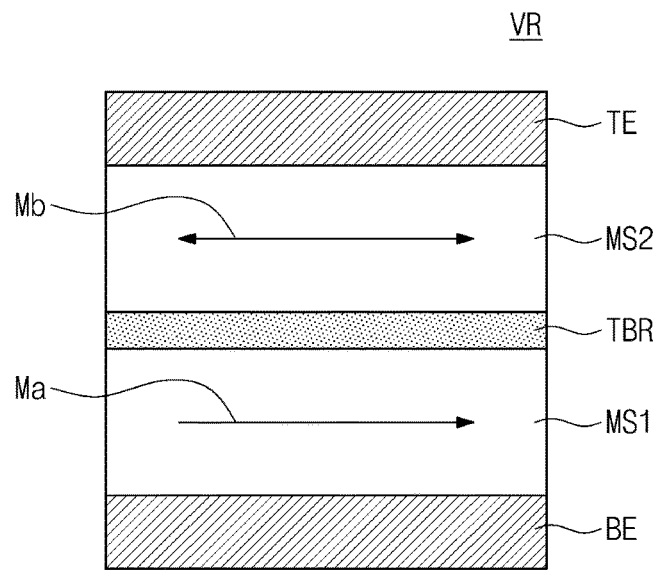
FIGS. 12A and 12B illustrate cross-sectional views of a variable resistance element according to example embodiments of the present inventive concepts.
Figure 12B:
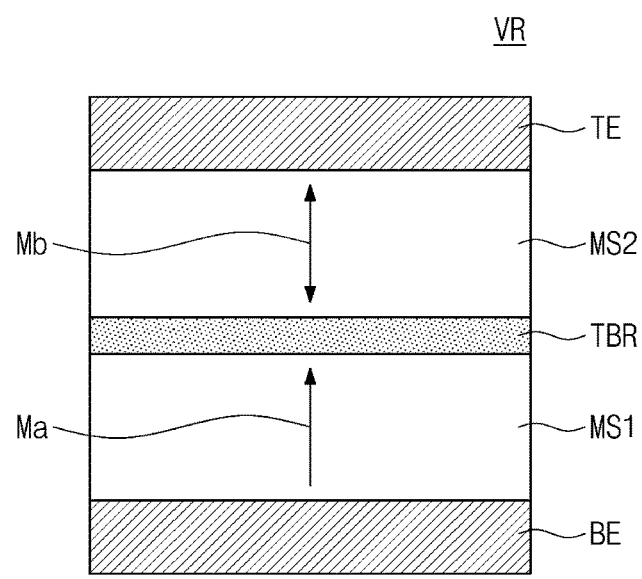

FIGS. 12A and 12B illustrate cross-sectional views of a variable resistance element according to example embodiments of the present inventive concepts.

Referring to FIGS. 12A and 12B, the variable resistance element VR may include a first magnetic structure MS1, a second magnetic structure MS2, and a tunnel barrier pattern TBR between the first and second magnetic structures MS1 and MS2. The variable resistance element VR may include a bottom electrode BE spaced apart from the tunnel barrier pattern TBR across the first magnetic structure MS1 and a top electrode TE spaced apart from the tunnel barrier pattern TBR across the second magnetic structure MS2. The bottom electrode BE may be in contact with the bottom electrode contact BEC discussed with reference to FIGS. 7 to 11. The top and bottom electrodes TE and BE may include metal and/or conductive metal nitride. The first magnetic structure MS1 may include a reference layer whose magnetization direction Ma is fixed in one direction, and the second magnetic structure MS2 may include a free layer whose magnetization direction Mb is switchable to be parallel or anti-parallel to the magnetization direction Ma of the reference layer. Differently from those shown in FIGS. 12A and 12B, in some embodiments, the first magnetic structure MS1 may include a free layer, and the second magnetic structure MS2 may include a reference layer.

Referring to FIG. 12A, the variable resistance element VR may be a magnetic tunnel junction pattern having a horizontal (longitudinal) magnetization. In this case, the magnetization directions Ma and Mb of the reference and free layers may be substantially parallel to an interface between the tunnel barrier pattern TBR and the first magnetic structure MS1. For example, the reference and free layers may each include a ferromagnetic material. The reference layer may further include an anti-ferromagnetic material that fixes a magnetization direction of the ferromagnetic material.

Referring to FIG. 12B, the variable resistance element VR may be a magnetic tunnel junction pattern having a perpendicular magnetization. In this case, the magnetization directions Ma and Mb of the reference and free layers may be substantially perpendicular to the interface between the tunnel barrier pattern TBR and the first magnetic structure MS1. For example, the reference and free layers may each include one or more of a perpendicular magnetization material (e.g., CoFeTb, CoFeGd, CoFeDy) and a perpendicular magnetization structure. The perpendicular magnetization structure may include magnetic layers and non-magnetic layers that are alternately and repeatedly stacked. For example, the perpendicular magnetization structure may include one or more of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where n is the stack number).

Figure 13:
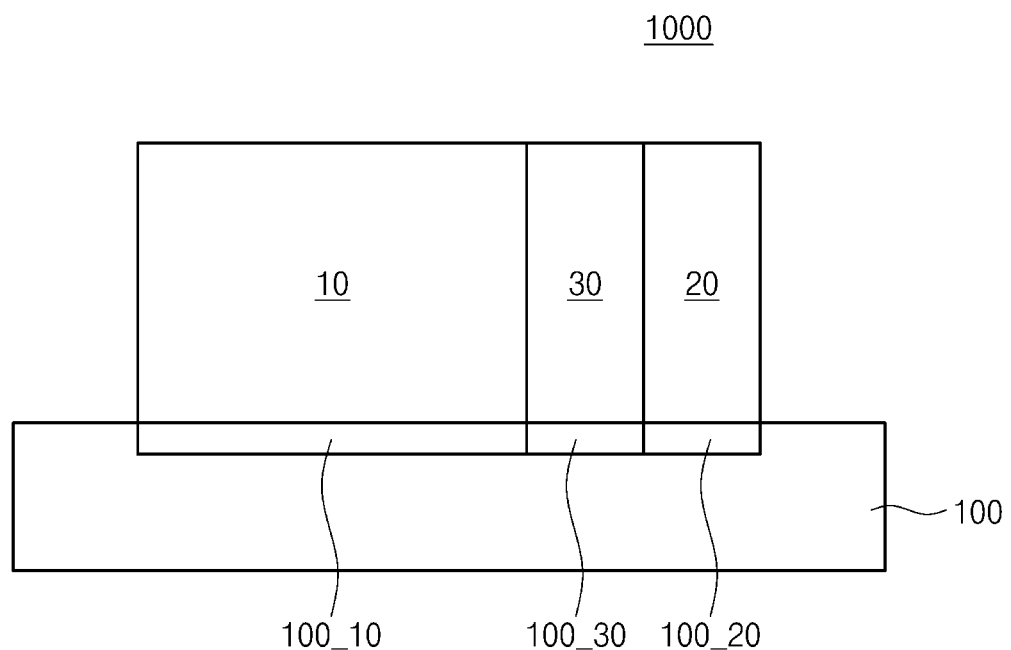
FIG. 13 illustrates a simplified cross-sectional view of a semiconductor device according to example embodiments of the present inventive concepts.

FIG. 13 illustrates a simplified cross-sectional view of a semiconductor device according to example embodiments of the present inventive concepts. Referring to FIG. 13, the semiconductor device 1000 may include the first memory section 10, the second memory section 20, and the peripheral circuit section 30 that is provided on one side of the first memory section 10. The first memory section 10, the second memory section 20, and the peripheral circuit section 30 may be disposed side by side on the substrate 100. In some embodiments, the peripheral circuit section 30 may be provided between the first and second memory sections 10 and 20, as illustrated in FIG. 13. According to the present embodiments, the peripheral circuit section 30 may be substantially the same as the peripheral circuit section 30 discussed with reference to FIG. 6. The peripheral circuit section 30 may include a peripheral circuit region 100_30 of the substrate 100.

Figure 14:
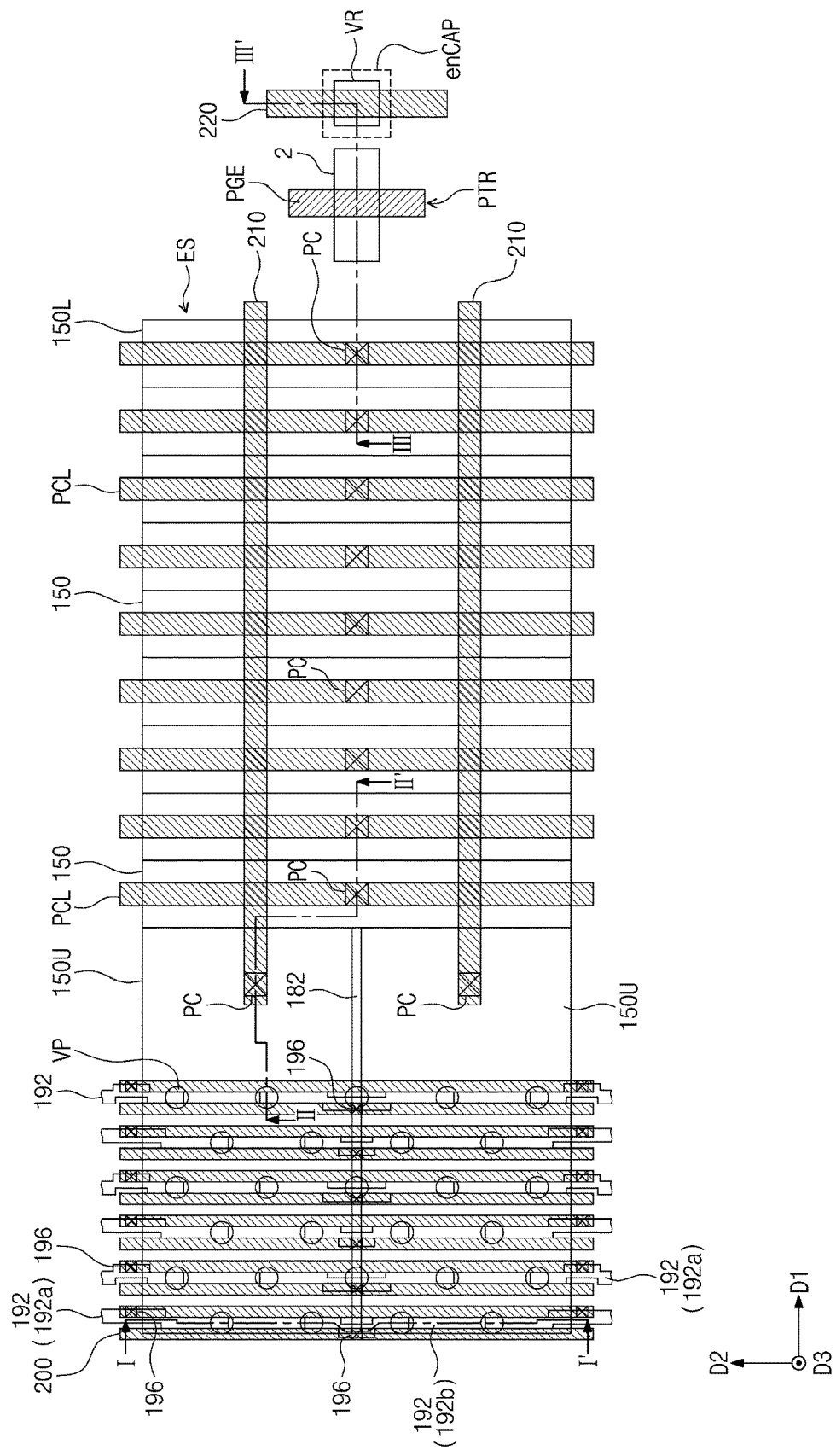
FIG. 14 illustrates a plan view of the semiconductor device of FIG. 13 according to example embodiments of the present inventive concepts.
Figure 15:
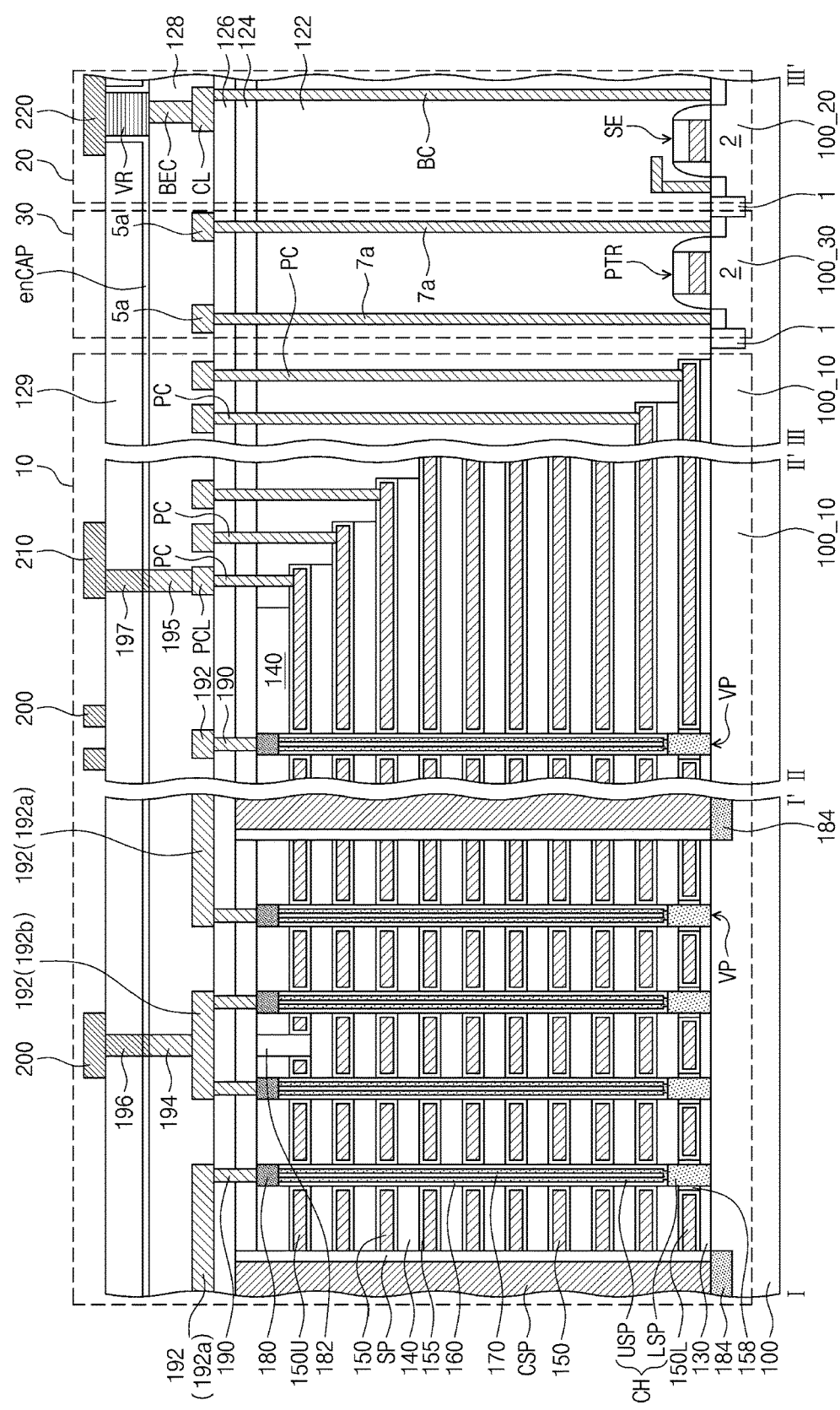
FIG. 15 illustrates a cross-sectional view taken along the lines I-I', II-II', and III-III' of FIG. 14 according to example embodiments of the present inventive concepts.

FIG. 14 illustrates a plan view of the semiconductor device of FIG. 13 according to example embodiments of the present inventive concepts, and FIG. 15 illustrates cross-sectional views taken along the lines I-I', II-II', and III-III' of FIG. 14.

Referring to FIGS. 14 and 15, the first memory section 10 may include a three-dimensional NAND flash memory cell structure provided on the substrate 100. For example, the electrode structure ES may be provided on the substrate 100, and a plurality of vertical patterns VP may penetrate the electrode structure ES and may be in contact with the substrate 100. Each of the vertical patterns VP may include the lower semiconductor pattern LSP, which penetrates a lower portion of the electrode structure ES and is connected to the substrate 100, and the upper semiconductor pattern USP, which penetrates an upper portion of the electrode structure ES and is connected to the lower semiconductor pattern LSP. The lower semiconductor pattern LSP may be an epitaxial pattern formed (e.g., grown) using the substrate 100 as a seed. The common source regions 184 may be provided in the substrate 100 on opposite sides of the electrode structure ES. The first capping insulating layer 122 may be provided on the substrate 100 and may cover the stepwise-shape end portion of the electrode structure ES. According to the present embodiments, the first memory section 10 may be substantially the same as or similar to the three-dimensional NAND flash memory cell structure discussed with reference to FIGS. 7 and 8.

The peripheral circuit section 30 may include the peripheral transistors PTR disposed on the substrate 100. According to the present embodiments, the peripheral transistors PTR may be disposed on at least one side of the electrode structure ES of the first memory section 10. The first capping insulating layer 122 may have a portion, which is provided on the substrate 100 and which covers the peripheral transistors PTR, included in the peripheral circuit section 30. The second capping insulating layer 124 and the first to third interlayer dielectric layers 126, 128, and 129 may have their portions, which are sequentially stacked on the first capping insulating layer 122, included in the peripheral circuit section 30. The peripheral circuit section 30 may include peripheral electrical lines 5a and peripheral contacts 7a that are electrically connected to the peripheral transistors PTR. The peripheral electrical lines 5a and the peripheral contacts 7a may each penetrate at least one or more of the first and second capping insulating layers 122 and 124 and at least one or more of the first to third interlayer dielectric layers 126, 128, and 129. The peripheral transistors PTR, the peripheral electrical lines 5a, and the peripheral contacts 7a may constitute the memory controller that operates the first memory cells of the first memory section 10.

The second memory section 20 may include the select element SE disposed on the substrate 100. According to the present embodiments, the select element SE may be disposed on at least one side of the electrode structure ES of the first memory section 10, and may be positioned at substantially the same height from the substrate 100 as those of the peripheral transistors PTR. The peripheral transistors PTR and the select element SE may be substantially the same in terms of one or more of their structure, their material, and their formation method. The second memory section 20 may include the variable resistance element VR electrically connected to one terminal of the select element SE. The second memory section 20 may be substantially the same as or similar to that discussed with reference to FIGS. 7 and 8, except that there is no lower interlayer dielectric layer 110 between the select element SE and the first capping insulating layer 122. In some embodiments, the second memory section 20 may be substantially the same as or similar to that discussed with reference to either FIGS. 7 and 9 or FIGS. 7 and 10, except that there is no lower interlayer dielectric layer 110 between the select element SE and the first capping insulating layer 122.

Figure 16:
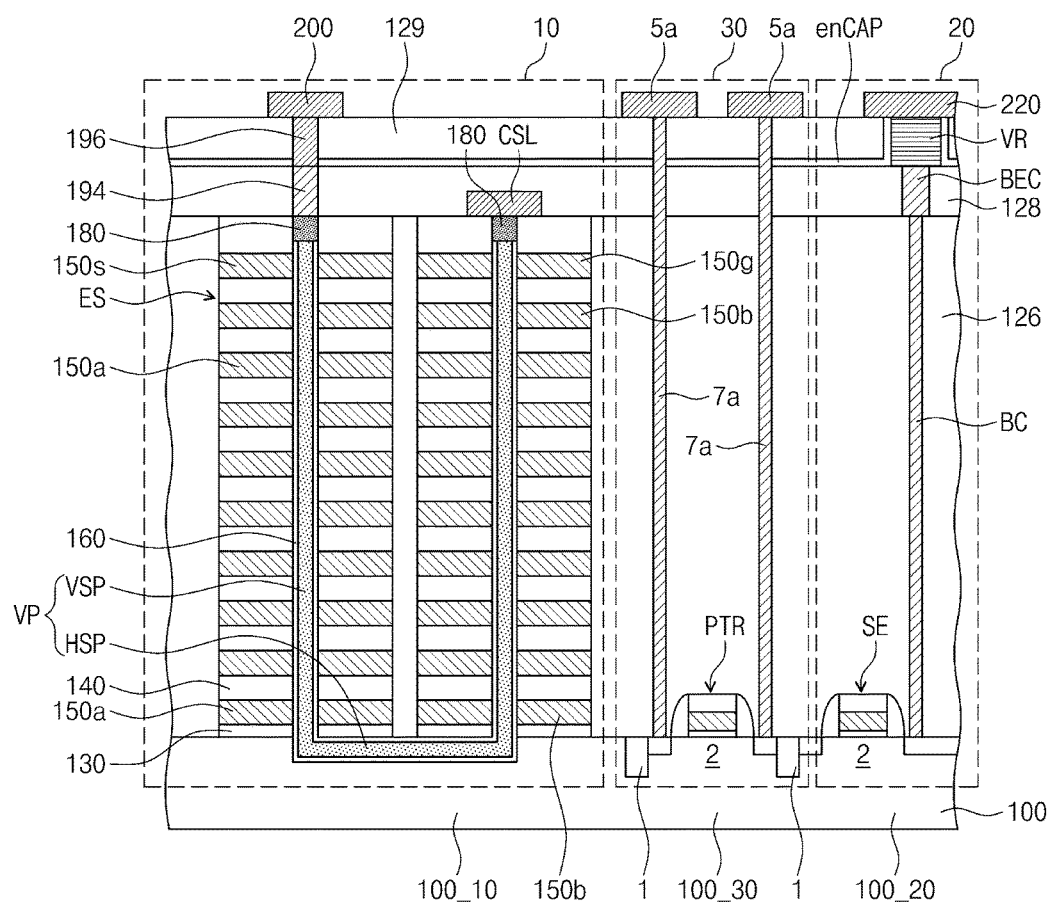
FIG. 16 illustrates a cross-sectional view of the semiconductor device of FIG. 13 according to example embodiments of the present inventive concepts.

FIG. 16 illustrates a cross-sectional view of the semiconductor device of FIG. 13 according to example embodiments of the present inventive concepts.

Referring to FIG. 16, the first memory section 10 may include a three-dimensional NAND flash memory cell structure provided on the substrate 100. For example, the electrode structure ES may be provided on the substrate 100, and the vertical pattern VP may penetrate the electrode structure ES and may connect the bit line 200 to the common source line CSL. The vertical pattern VP may include the pair of vertical semiconductor patterns VSP and the horizontal semiconductor pattern HSP. The horizontal semiconductor pattern HSP may be provided between the substrate 100 and the electrode structure ES and may connect the pair of vertical semiconductor patterns VSP to each other. The substrate 100 may be provided thereon with the first interlayer dielectric layer 126 that covers the electrode structure ES. According to the present embodiments, except for the difference mentioned above, the first memory section 10 may be substantially the same as or similar to the three-dimensional NAND flash memory cell structure discussed with reference to FIG. 11.

The peripheral circuit section 30 may include the peripheral transistors PTR disposed on the substrate 100. According to the present embodiments, the peripheral transistors PTR may be disposed on at least one side of the electrode structure ES of the first memory section 10. The first interlayer dielectric layer 126 may have a portion, which is provided on the substrate 100 and covers the peripheral transistors PTR, included in the peripheral circuit section 30. The second and third interlayer dielectric layers 128 and 129 may have their portions, which are sequentially stacked on the first interlayer dielectric layer 126, included in the peripheral circuit section 30. The peripheral circuit section 30 may include the peripheral electrical lines 5a and the peripheral contacts 7a that are electrically connected to the peripheral transistors PTR. The peripheral electrical lines 5a and the peripheral contacts 7a may each penetrate at least one or more of the first to third interlayer dielectric layers 126, 128, and 129. The peripheral transistors PTR, the peripheral electrical lines 5a, and the peripheral contacts 7a may constitute the memory controller that operates the first memory cells of the first memory section 10.

The second memory section 20 may include the select element SE disposed on the substrate 100. According to the present embodiments, the select element SE may be disposed on at least one side of the electrode structure ES of the first memory section 10 and may be positioned at substantially the same height from the substrate 100 as those of the peripheral transistors PTR. The peripheral transistors PTR and the select element SE may be substantially the same in terms of one or more of their structure, their material, and their formation method. The second memory section 20 may include the variable resistance element VR electrically connected to one terminal of the select element SE. The second memory section 20 may be substantially the same as or similar to that discussed with reference to FIG. 11, except that there is no lower interlayer dielectric layer 110 between the select element SE and the first interlayer dielectric layer 126.

Figure 17:
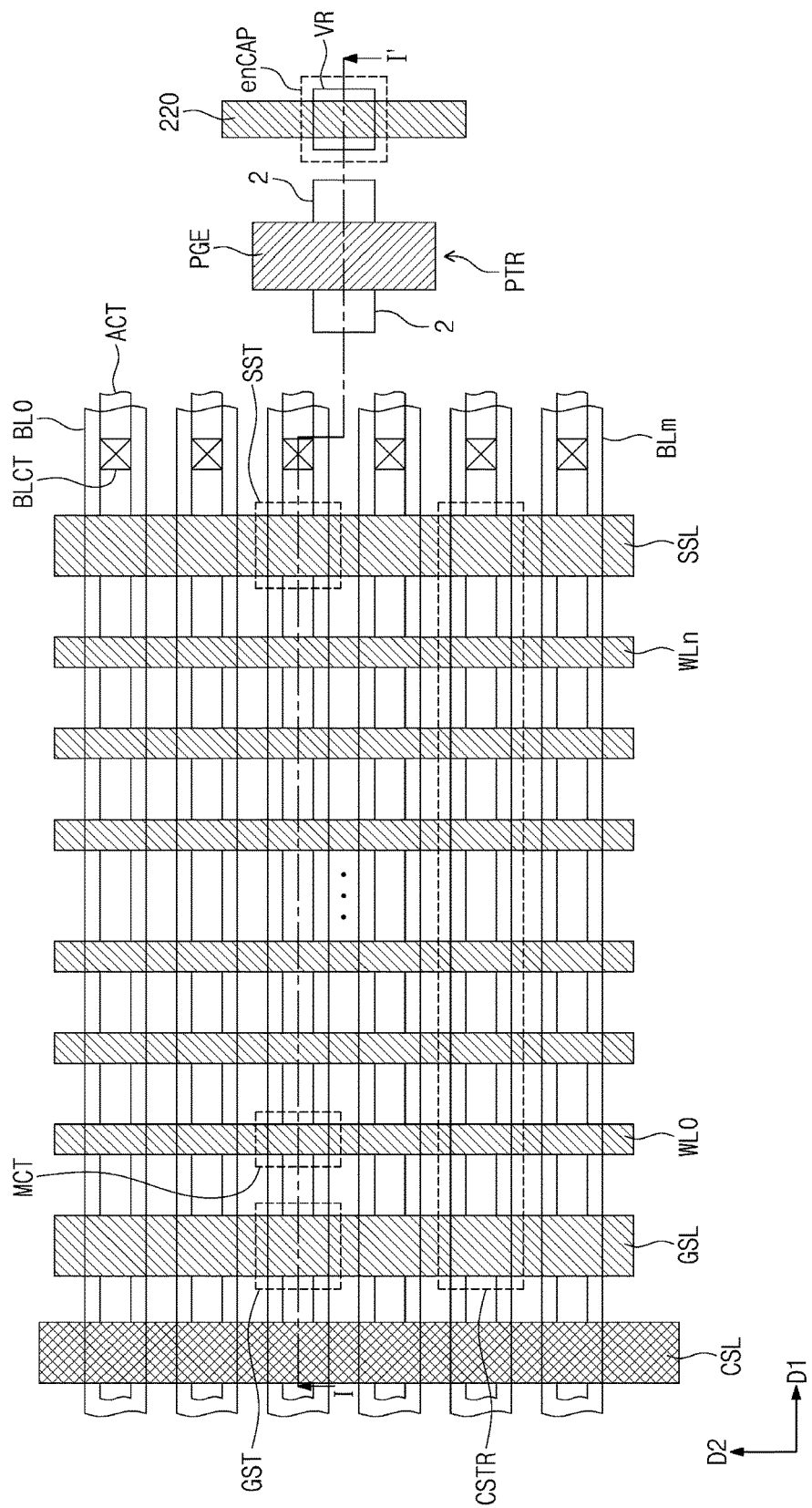
FIG. 17 illustrates a plan view of the semiconductor device of FIG. 13 according to example embodiments of the present inventive concepts.
Figure 18:
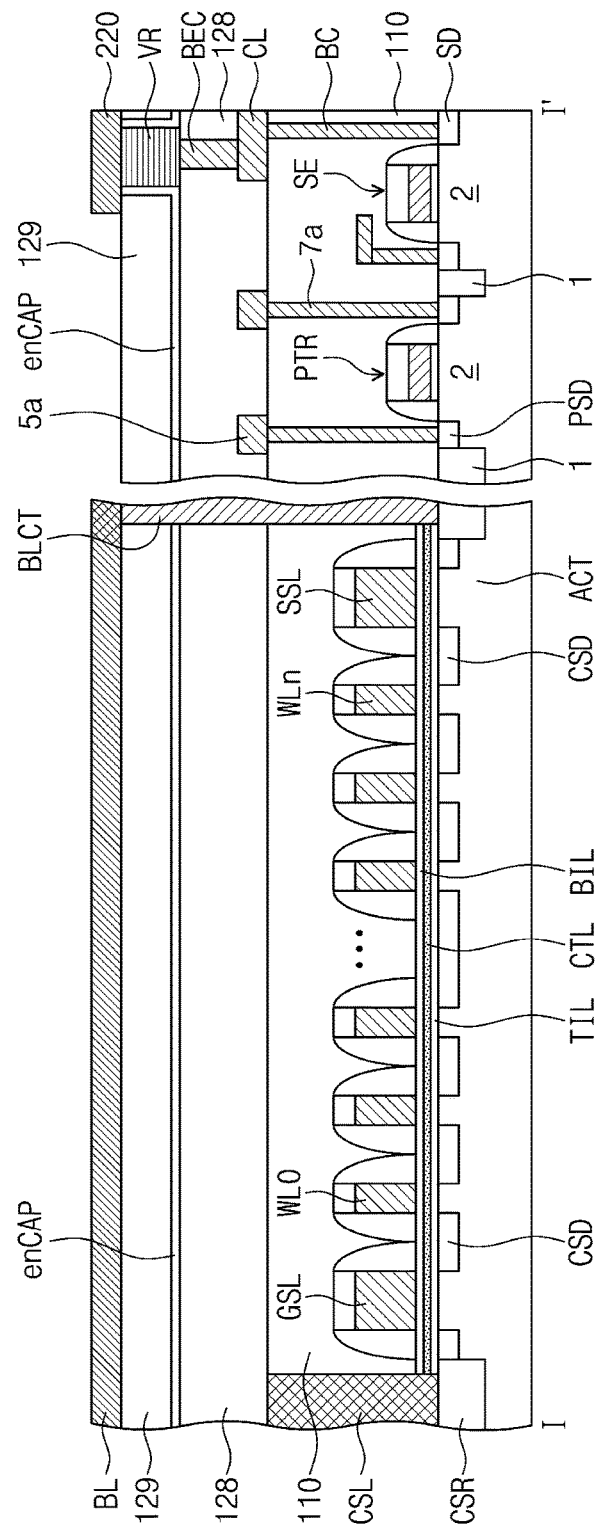
FIG. 18 illustrates a cross-sectional view taken along the line I-I' of FIG. 17.

FIG. 17 illustrates a plan view of the semiconductor device of FIG. 13 according to example embodiments of the present inventive concepts. FIG. 18 illustrates a cross-sectional view taken along the line I-I' of FIG. 17.

Referring to FIGS. 17 and 18, the first memory section 10 may include a two-dimensional NAND flash memory cell array (e.g., a planar NAND flash memory cell array). The first memory section 10 may include a plurality of cell strings CSTR, each of which may include a string select transistor SST, a plurality of memory cell transistors MCT, and a ground select transistor GST. In some embodiments, each of the cell strings CSTR may include a tunnel insulating layer TIL, a charge storage layer CTL, and a blocking insulating layer BIL that are sequentially stacked on the first memory region 100_10 of the substrate 100 and are shared by the transistors included in a single cell string CSTR (i.e., the string select transistor SST, the plurality of memory cell transistors MCT, and the ground select transistor GST), as illustrated in FIG. 18. Cell source/drain regions CSD of the plurality of memory cell transistors MCT may be formed in the first memory region 100_10 of the substrate 100.

The first memory section 10 may include a string select line SSL, which is a gate electrode of a plurality of string select transistors SST, a plurality of word lines $WL_0$ to $WL_n$, each of which is a gate electrode of one of a plurality of memory cell transistors MCT, and a ground select line GSL, which is a gate electrode of a plurality of ground select transistors GST. In some embodiments, the string select line SSL, the plurality of word lines $WL_0$ to $WL_n$, and the ground select line GSL may extend in the second direction D2 and may be spaced apart from each other in the first direction D1, as illustrated in FIG. 17.

The first memory section 10 may also include a common source region CSR that is a source region of the plurality of ground select transistors GST and is formed in the first memory region 100_10 of the substrate 100. The common source region CSR may be electrically connected to a common source line CSL, which may include a conductive material. A plurality of bit lines $BL_0$ to $BL_m$ may be included in the first memory section 10, and each of the plurality of bit lines $BL_0$ to $BL_m$ may be connected to a drain region of each of the plurality of string select transistors SST through a bit line contact BLCT.

Still referring to FIGS. 17 and 18, the semiconductor device may include a second memory section 20 that is similar to the second memory section 20 illustrated in FIG. 15. In some embodiments, a variable resistance element VR is disposed higher than the transistors of the first memory section 10 (i.e., the string select transistor SST, the plurality of memory cell transistors MCT, and the ground select transistor GST) as illustrated in FIG. 18. Specifically, a lower surface of the variable resistance element VR, which faces the substrate 100, may be higher than top surfaces of the gate electrodes of the transistors of the first memory section 10 as illustrated in FIG. 18. In some embodiments, an upper surface of the variable resistance element VR, which is opposite the lower surface of the variable resistance element VR, may be coplanar with an upper surface of the bit line contact BLCT of the first memory section 10. The semiconductor device may further include a third memory section 30 that is similar to the third memory section 30 illustrated in FIG. 15.

As illustrated in FIG. 18, in some embodiments, both the second interlayer dielectric layer 128 and the third interlayer dielectric layer 129 may extend continuously from the first memory section 10 to the second memory section 20 to overlap the plurality of cell strings CSTR of the first memory section 10 and a select element SE of the second memory section 20. In some embodiments, an encapsulating layer enCAP may also extend continuously from the first memory section 10 to the second memory section 20 to overlap the plurality of cell strings CSTR of the first memory section 10 and the select element SE of the second memory section 20, as illustrated in FIG. 18. The encapsulating layer enCAP may be disposed on a side of the variable resistance element VR and may continuously extend from the side of the variable resistance element VR onto the first memory region 100_10 of the substrate 100. The bit line contact BLCT may extend through the encapsulating layer enCAP. The encapsulating layer enCAP may enclose, in some embodiments, completely enclose as illustrated in FIG. 17, the side of the variable resistance element VR in a plan view.

Figure 19:
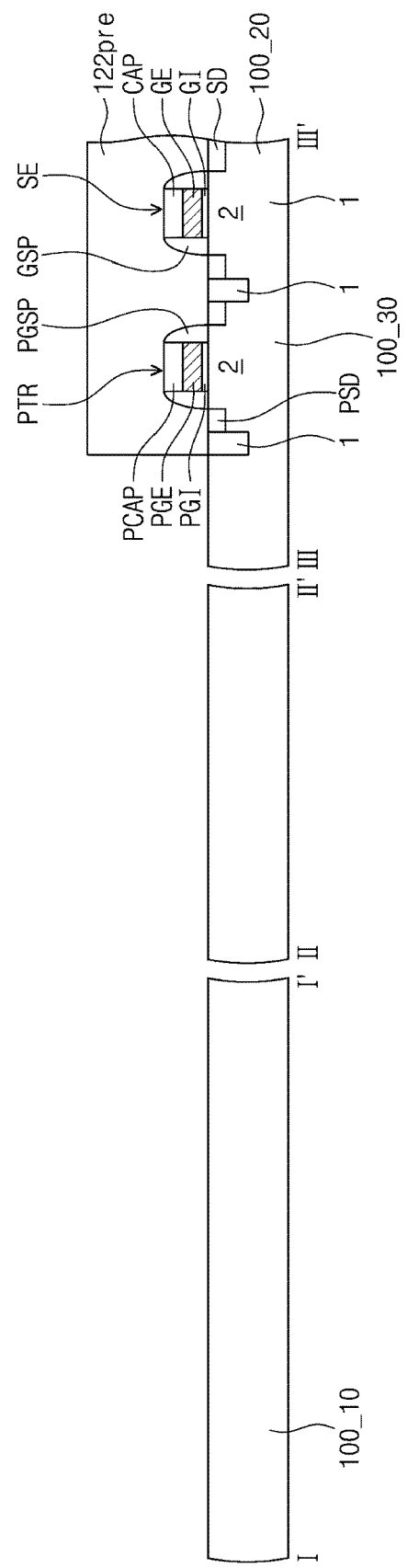
FIGS. 19, 20 and 21 illustrate a method of forming a semiconductor device according to example embodiments of the present inventive concepts.
Figure 20:
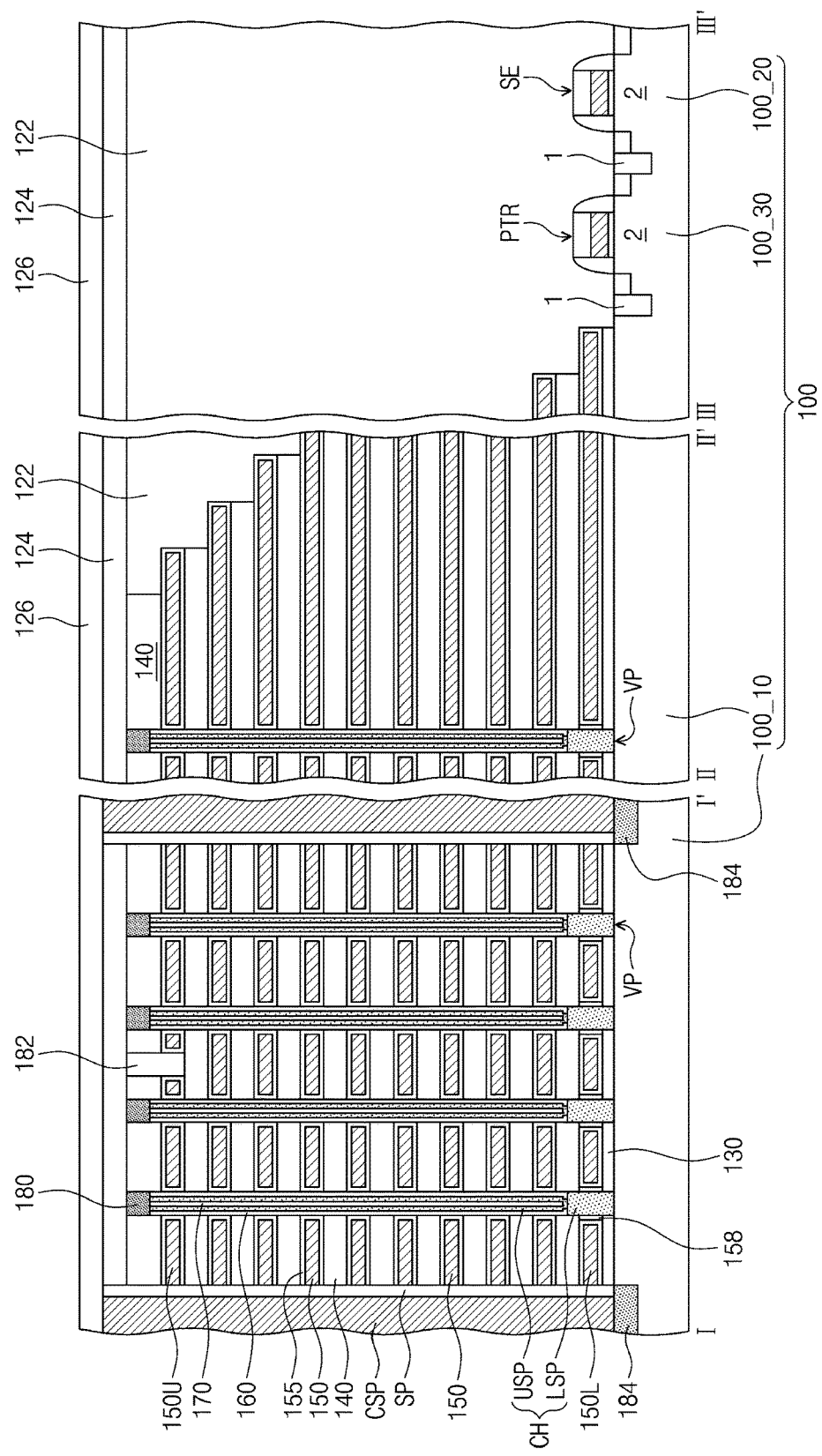
Figure 21:
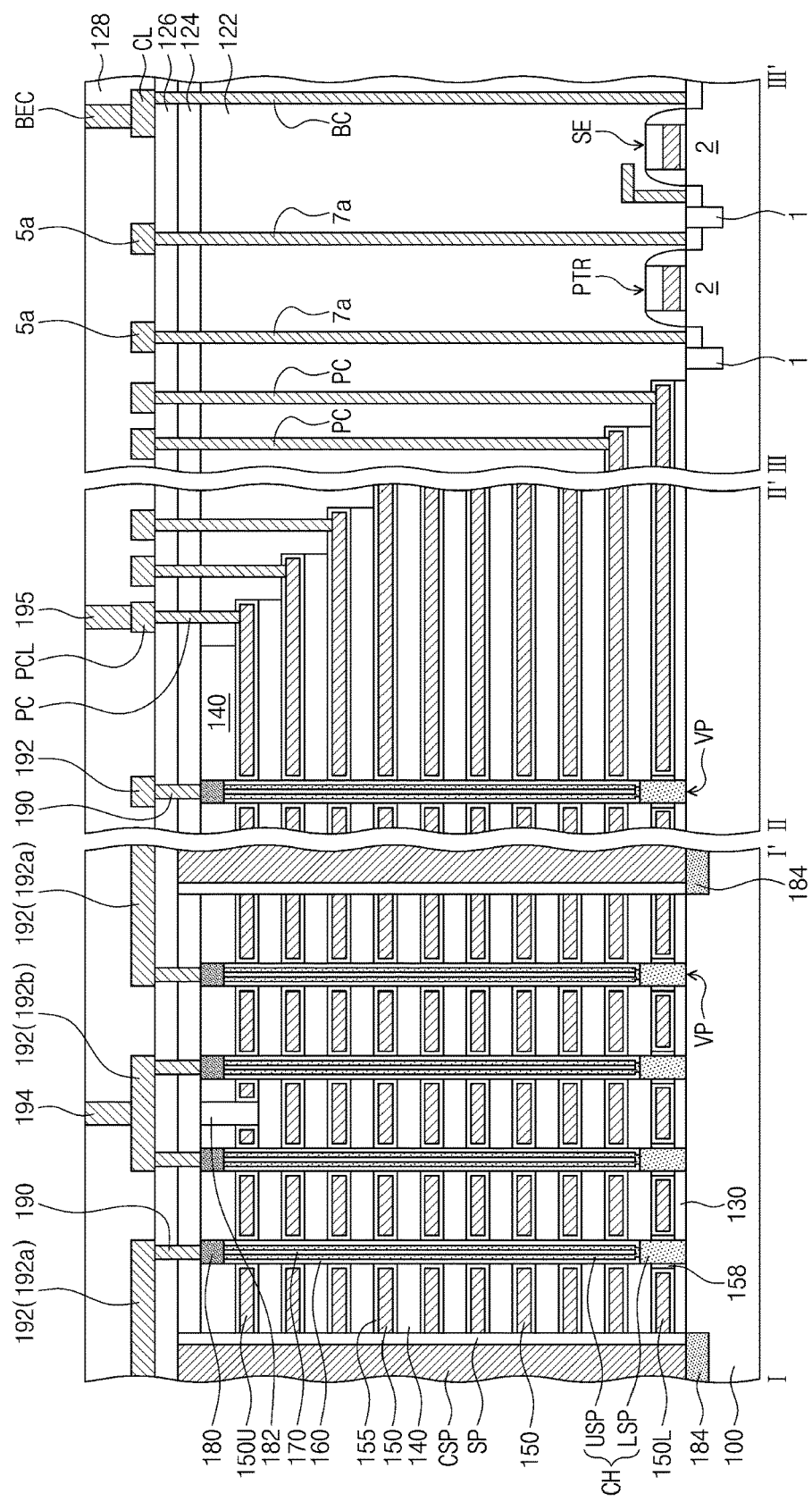

FIGS. 19, 20 and 21 illustrate a method of forming the semiconductor device illustrated in FIG. 15 according to example embodiments of the present inventive concepts.

Referring to FIG. 19, the peripheral transistors PTR and the select element SE may be formed in the peripheral circuit section 30 and the second memory section 20, respectively. Both of the peripheral transistors PTR and the select element SE may be field effect transistors. The peripheral gate dielectric pattern PGI and the gate dielectric pattern GI may be concurrently formed using the same process, and the peripheral gate electrode PGE and the gate electrode GE may be concurrently formed using the same process. Accordingly, the peripheral gate dielectric pattern PGI and the gate dielectric pattern GI may be formed of the same material and may have substantially the same thickness. Further, the peripheral gate electrode PGE and the gate electrode GE may be formed of the same material and may have substantially the same thickness. Thus, upper surfaces of the peripheral gate electrode PGE and the gate electrode GE may be coplanar as illustrate in FIG. 19.

The peripheral gate spacers PGSP and the gate spacers GSP may also be concurrently formed using the same process, and thus the peripheral gate spacers PGSP and the gate spacers GSP may be formed of the same material and may have substantially the same shape. The peripheral gate capping pattern PCAP and the gate capping pattern CAP may also be concurrently formed using the same process, and thus the peripheral gate capping pattern PCAP and the gate capping pattern CAP may be formed of the same material and may have substantially the same thickness. Thus, upper surfaces of the peripheral gate capping pattern PCAP and the gate capping pattern CAP may be coplanar as illustrate in FIG. 19. The peripheral source/drain regions PSD may be formed in the peripheral circuit region 100_30 of the substrate 100, and the source/drain regions SD may be formed in the second memory region 100_20 of the substrate 100. All layers included in the peripheral transistors PTR and the select element SE may be formed on the first memory region 100_10 of the substrate 100 and then may be removed to expose the first memory region 100_10 of the substrate 100.

As illustrated in FIG. 20, after the peripheral transistors PTR and the select element SE are formed, elements (e.g., the electrode structure ES) of the first memory section 10 may be formed, and then the first capping insulating layer 122 overlapping the first memory region 100_10, the second memory region 100_20, and the peripheral circuit region 100_30 may be formed using a single deposition process (e.g., a chemical vapor deposition process (CVD)). Accordingly, the first capping insulating layer 122 may extend continuously from the first memory section 10 into the second memory section 20. The second capping insulating layer 124 and the first interlayer dielectric layer 126 may be sequentially formed on the first capping insulating layer 122. Each of the second capping insulating layer 124 and the first interlayer dielectric layer 126 may be formed using a single deposition process and may extend continuously from the first memory section 10 into the second memory section 20.

Referring to FIG. 21, the lower contacts 190 and the lower pad contacts PC of the first memory section 10, the buried contact BC of the second memory section 20, and the peripheral contacts 7a of the peripheral circuit section 30 may be formed concurrently. Specifically, the same photolithography process and etching process may be used to form openings that extend though the first capping insulating layer 122, the second capping insulating layer 124 and the first interlayer dielectric layer 126, and then the same conductive material may be formed in the openings to form the lower contacts 190, the lower pad contacts PC, the buried contact BC and the peripheral contacts 7a. Accordingly, the lower contacts 190, the lower pad contacts PC, the buried contact BC and the peripheral contacts 7a may be formed of the same material, and upper surfaces of the lower contacts 190, the lower pad contacts PC, the buried contact BC, and the peripheral contacts 7a may be coplanar with each other, as illustrated in FIG. 21. In some embodiments, an upper surface of the first interlayer dielectric layer 126 may be coplanar with the upper surfaces of the lower contacts 190, the lower pad contacts PC, the buried contact BC, and the peripheral contacts 7a.

The subsidiary conductive lines 192 and the lower pad lines PCL of the first memory section 10, the conductive pattern CL of the second memory section 20, and the peripheral electrical lines 5a may be formed concurrently using the same deposition process and etching process. In some embodiments, a conductive layer that overlaps the lower contacts 190, the lower pad contacts PC, the buried contact BC, and the peripheral contacts 7a may be formed and then may be etched to form the subsidiary conductive lines 192, the lower pad lines PCL, the conductive pattern CL, and the peripheral electrical lines 5a. Accordingly, the subsidiary conductive lines 192, the lower pad lines PCL, the conductive pattern CL, and the peripheral electrical lines 5a may be formed of the same material and may have may have substantially the same thickness, as illustrated in FIG. 21.

Still, referring to FIG. 21, the second interlayer dielectric layer 128 may be formed to extend continuously on and to overlap the subsidiary conductive lines 192, the lower pad lines PCL, the conductive pattern CL, and the peripheral electrical lines 5a using the same deposition process. Openings extending through the second interlayer dielectric layer 128 may be formed and then a conductive layer may be formed in the openings to form the middle contacts 194, the middle pad contact 195, and the bottom electrode contact BEC. Accordingly, the middle contacts 194, the middle pad contact 195, and the bottom electrode contact BEC may be formed of the same conductive material, and upper surfaces of the middle contacts 194, the middle pad contact 195, and the bottom electrode contact BEC may be coplanar with each other, as illustrated in FIG. 21. In some embodiments, an upper surface of the second interlayer dielectric layer 128 may be coplanar with the upper surfaces of the middle contacts 194, the middle pad contact 195, and the bottom electrode contact BEC, as illustrated in FIG. 21. Referring again to FIG. 15, the variable resistance element VR may be formed on the second interlayer dielectric layer 128, and then the encapsulating layer enCAP may be formed using a deposition process such that the encapsulating layer enCAP may extend continuously from the second memory section 20 into the first memory section 10.

As appreciated by the present inventors, the electrode structure ES may be formed using one or more processes performed at high temperature (e.g., 500° C.), which may damage the variable resistance element VR. As discussed with reference to FIGS. 19 to 21, according to embodiments of the present inventive concepts, the variable resistance element VR may be formed after the electrode structure ES is formed. Accordingly, the variable resistance element VR may not be damaged by high temperature processes used to form the electrode structure ES, and the variable resistance element VR may be disposed higher than the pair of uppermost gate electrodes 150U, as illustrated in FIGS. 8 to 11 and FIG. 15.

According to the present inventive concepts, a single substrate 100 (e.g., a single wafer) may be used to form the first and second memory sections 10 and 20, which are disposed side by side and have different operating characteristics from each other and are included in a single chip. Therefore, a single chip may include both first and second memory sections 10 and 20 formed on a portion of a single substrate 100, and portions of the substrate 100 included in the first and second memory sections 10 and 20 may have continuous crystal structure and may form a unitary structure. The substrate 100 may be provided thereon with the peripheral circuit section 30 including the peripheral transistors PTR. The select element SE of the second memory section 20 may be disposed at substantially the same height from the substrate 100 as those of the peripheral transistors PTR. As the select element SE and the peripheral transistors PTR are positioned at substantially the same level, the first and second memory sections 10 and 20 may be easily disposed side by side on the single substrate 100. Accordingly, a semiconductor device with high integration may be easily provided.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:
1. An integrated circuit device comprising:
a substrate comprising a flash memory region and a variable resistance memory region;
a flash memory cell transistor comprising a cell gate electrode that overlaps the flash memory region of the substrate;
a variable resistance element that overlaps the variable resistance memory region of the substrate;
a bit line connected to the variable resistance element; and
a select transistor comprising a select source/drain region that is disposed in the variable resistance memory region of the substrate, the select source/drain region being electrically connected to the variable resistance element,
wherein the substrate comprises an upper surface facing the cell gate electrode and the variable resistance element, and the upper surface of the substrate continuously extends from the flash memory region to the variable resistance memory region.
2. The integrated circuit device of claim 1, wherein the flash memory region and the variable resistance memory region of the substrate comprise a unitary structure.
3. The integrated circuit device of claim 1, wherein the flash memory cell transistor comprises a data storage element, and
wherein the integrated circuit device further comprises:
an insulating layer, the variable resistance element being in the insulating layer; and
an encapsulating layer that extends between a side of the variable resistance element and the insulating layer,
wherein the encapsulating layer continuously extends from the side of the variable resistance element onto the flash memory region and overlaps the flash memory cell transistor.
4. The integrated circuit device of claim 3, wherein the encapsulating layer encloses the side of the variable resistance element in a plan view, and
wherein the encapsulating layer comprises a material different from the insulating layer and comprises nitride.
5. The integrated circuit device of claim 1, wherein a lower surface of the variable resistance element is higher than an upper surface of the cell gate electrode.
6. The integrated circuit device of claim 5, wherein the cell gate electrode comprises a plurality of cell gate electrodes vertically stacked on the flash memory region of the substrate, and
wherein the lower surface of the variable resistance element is higher than an upper surface of an uppermost one of the plurality of cell gate electrodes.
7. The integrated circuit device of claim 1, further comprising a peripheral transistor that is configured to generate a signal for operation of the flash memory cell transistor and comprises a peripheral source/drain region disposed in the substrate.
8. The integrated circuit device of claim 1, wherein the flash memory cell transistor comprises a cell source/drain region that is disposed in the flash memory region of the substrate.
9. An integrated circuit device comprising:
a substrate comprising a flash memory region and a variable resistance memory region;
a flash memory cell transistor comprising a cell gate electrode that overlaps the flash memory region of the substrate;
a variable resistance element that overlaps the variable resistance memory region of the substrate;
a bit line connected to the variable resistance element;

a select element configured to control current flowing through the variable resistance element; and an interlayer insulating layer extending continuously to overlap both the flash memory cell transistor and the select element.

10. The integrated circuit device of claim 9, wherein a lower surface of the variable resistance element is higher than an upper surface of the cell gate electrode.

11. The integrated circuit device of claim 9, wherein the flash memory cell transistor comprises a data storage element, and wherein the integrated circuit device further comprises:

an insulating layer, the variable resistance element being in the insulating layer; and an encapsulating layer that extends between a side of the variable resistance element and the insulating layer, wherein the encapsulating layer continuously extends from the side of the variable resistance element onto the flash memory region and overlaps the flash memory cell transistor.

12. The integrated circuit device of claim 11, wherein the insulating layer comprises an upper insulating layer, and the variable resistance element is in the upper insulating layer, wherein the integrated circuit device further comprises a lower insulating layer extending between the variable resistance element and the substrate, and wherein the encapsulating layer extends between the upper insulating layer and the lower insulating layer.

13. The integrated circuit device of claim 9, further comprising a peripheral transistor that is configured to generate a signal for operation of the flash memory cell transistor and comprises a peripheral source/drain region disposed in the flash memory region of the substrate, wherein the select element comprises a select transistor that comprises a select source/drain region disposed in the variable resistance memory region of the substrate.

14. The integrated circuit device of claim 13, wherein the peripheral transistor comprises a peripheral gate electrode that is disposed between the flash memory cell transistor and the substrate.

15. The integrated circuit device of claim 9, wherein the flash memory cell transistor comprises a cell source/drain region that is disposed in the flash memory region of the substrate, and wherein the select element comprises a select transistor that comprises a select source/drain region that is disposed in the variable resistance memory region of the substrate.

16. An integrated circuit device comprising:

a substrate;

a flash memory cell transistor comprising a cell gate electrode that is disposed on the substrate;

a peripheral transistor that is configured to generate a signal for operation of the flash memory cell transistor, the peripheral transistor comprising a peripheral gate electrode and a peripheral source/drain region that is disposed in the substrate;

a variable resistance element on the substrate;

a bit line connected to the variable resistance element; and a select transistor that is configured to control current flowing through the variable resistance element and comprises a select source/drain region that is disposed in the substrate.

17. The integrated circuit device of claim 16, wherein the substrate comprises a unitary structure.

18. The integrated circuit device of claim 16, wherein a lower surface of the variable resistance element is higher than an upper surface of the cell gate electrode.

19. The integrated circuit device of claim 16, wherein the flash memory cell transistor comprises a data storage element, and wherein the integrated circuit device further comprises:

an insulating layer, the variable resistance element being in the insulating layer; and an encapsulating layer extends between a side of the variable resistance element and the insulating layer, wherein the encapsulating layer continuously extends from the side of the variable resistance element onto the flash memory cell transistor and overlaps the flash memory cell transistor.

20. The integrated circuit device of claim 1, wherein the cell gate electrode does not overlap the select transistor.

* * * * *